United States Patent
Comberiate et al.

(10) Patent No.: US 11,456,792 B1
(45) Date of Patent: Sep. 27, 2022

(54) INTERMODULATION SUPPRESSION IN PHASED ARRAYS USING VOLTERRA FILTERS

(71) Applicant: Raytheon Company, Waltham, MA (US)

(72) Inventors: Thomas Comberiate, Laurel, MD (US); Zachary Dunn, Wylie, TX (US); Benjamin Plotner, Brooklyn Park, MD (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/390,224

(22) Filed: Jul. 30, 2021

(51) Int. Cl.
| H04B 7/06 | (2006.01) |
| H04L 25/02 | (2006.01) |
| H03F 3/24 | (2006.01) |
| H04B 7/08 | (2006.01) |

(52) U.S. Cl.
CPC ............. *H04B 7/0639* (2013.01); *H03F 3/24* (2013.01); *H04L 25/0204* (2013.01); *H03F 2200/451* (2013.01); *H04B 7/086* (2013.01)

(58) Field of Classification Search
CPC ......... H04B 7/0639; H04B 7/086; H03F 3/24; H03F 2200/451; H04L 25/0204
See application file for complete search history.

(56) References Cited

U.S. PATENT DOCUMENTS

| 6,351,740 | B1 | 2/2002 | Rabinowitz |
| 7,609,759 | B2 | 10/2009 | Raz et al. |
| 9,391,684 | B1 | 7/2016 | Marr et al. |
| 9,705,477 | B2* | 7/2017 | Velazquez ............... H04L 25/14 |
| 10,027,026 | B2 | 7/2018 | Marr |
| 10,536,302 | B1* | 1/2020 | Marr .................... H04L 25/0212 |
| 10,616,009 | B1* | 4/2020 | Hoffmann ........... H01Q 3/2694 |
| 10,623,118 | B2 | 4/2020 | Lagoy et al. |
| 10,965,023 | B2 | 3/2021 | Marr |
| 11,361,788 | B2* | 6/2022 | Bellorado ......... H03M 13/4146 |
| 2012/0013494 | A1* | 1/2012 | Song ................... H03M 1/0641 341/122 |

(Continued)

OTHER PUBLICATIONS

Abrudan, "Volterra Series and Nonlinear Adaptive Filters;" PowerPoint Presentation—Postgraduate Seminar on Signal Processing 1, Espoo; Oct. 30, 2003; 23 Pages.

(Continued)

*Primary Examiner* — Jaison Joseph
(74) *Attorney, Agent, or Firm* — Daly, Crowley, Mofford & Durkee, LLP

(57) ABSTRACT

A method of beamforming is provided. A single non-linear equalization (NLEQ) coefficient set is generated in beamspace, the single NLEQ coefficient set configured to characterize non-linear behavior of a system having an array of N elements. M parallel digital signals are received, for transmission by N channels, respectively, the N channels corresponding to the N elements. Each of the M respective parallel digital signals are equalized, using an NLEQ filter based on the single NLEQ coefficient set, wherein the single NLEQ coefficient set is used for each of the N elements and wherein the equalizing is configured to generate a set of M linearized parallel digital signals. Using a single summer, the M linearized parallel digital signals are summed, to produce one or more beamspace channelized output signals.

20 Claims, 21 Drawing Sheets

- $F_1 \ldots F_N$ are independent non-linear transfer functions
- $G^{-1}$ is the channel post-distortion filter applied at every channel

(56) References Cited

U.S. PATENT DOCUMENTS

2012/0027070 A1* 2/2012 Beidas ............... H04L 27/2691
375/229

OTHER PUBLICATIONS

Budura et al., "Nonlinearities Identification Using the LMS Volterra Filter;" Proceedings of the 2005 WSEAS International Conference on Dynamical Systems and Control (Control'05); Nov. 2005; pp. 148-153; 6 Pages.
Deepa, "Adaptive Equalization;" PowerPoint Presentation; SRM University; Aug. 11, 2018; Part 1 of 2; 12 Pages.
Deepa, "Adaptive Equalization;" PowerPoint Presentation; SRM University; Aug. 11, 2018; Part 2 of 2; 12 Pages.
Delos, "Receiver Design Considerations in Digital Beamforming Phased Arrays;" Microwave & RF; Sep. 12, 2014; 23 Pages.
Fermo et al., "Analysis of Different Low Complexity Nonlinear Filters for Acoustic Echo Cancellation;" Conference Paper in Journal of Computing and Information Technology—CIT 8; Feb. 2000; pp. 333-339; 7 Pages.
Lu, "Interference Suppression Techniques for Millimeter-Wave Integrated Receiver Front Ends;" Technische Universiteit Eindhoven; Published Nov. 24, 2015; 168 Pages.
MathWorks; *5G Phased Array Technologies*; eBook; Microwave Journal; Sep. 2019; 37 Pages.
Miller at al., "Nonlinear Equalization (NLEQ) of RF Receivers;" HPC-Enabled Search for a Near-Optimal NLEQ Architecture; Poster; 1 Page.
Peccarelli et al., "Adaptive Nonlinear Equalization for Digital Array Receivers;" IEEE Transactions on Microwave Theory and Techniques, vol. 67, No. 11; Nov. 2019; 12 Pages.
Peccarelli et al., "Mitigation of Nonlinear Spurious Products Using Least Mean-Square (LMS);" Conference Paper from the Defense Technical Information Center; Mar. 12, 2018; 6 Pages.
Peccarelli, "Nonlinear Equalization and Digital Pre-Distortion Techniques for Future Radar and Communications Digital Array Systems;" a Dissertation submitted to the Graduate Faculty in partial fulfillment of the requirements for the Degree of Doctor of Philosophy; Jan. 2020; 147 Pages.
Rai et al., "Analysis of Adaptive Volterra Filters with LMS and RLS Algorithms;" AKGEC Journal of Technology, vol. 2, No. 1; Jan. 2010; 6 Pages.
Rathod et al., "Evolutionary Trends in Transmit/Receive Module for Active Phased Array Radars;" Defence Science Journal, vol. 68, No. 6; Nov. 2018; pp. 553-559; 7 Pages.
Talisa et al., "Benefits of Digital Phased Array Radars;" Invited Paper; Proceedings of the IEEE, vol. 104, No. 3; Mar. 2016; 14 Pages.
Vai, "Nonlinear Equalization for Receiver Dynamic Range Extension;" Tech Notes; Lincoln Laboratory—Massachusetts Institute of Technology; 2 Pages.

* cited by examiner

| Error Type | Can it be Decorrelated? |
|---|---|
| Mixing spurs ($mf_{RF} \pm nf_{LO}$) | Yes |
| ADC Harmonics | Yes |
| Third-order intermodulation ($2f_1 - f_2$) | NO |
| Quantization Noise | Yes |
| Thermal Noise | Yes (independent) |

One beamspace NLEQ filter is generated for the entire array

- $F_1 ... F_N$ are independent non-linear transfer functions
- $G^{-1}$ is the post-distortion filter of the summed output

- $F_1 ... F_N$ are independent non-linear transfer functions
- $G^{-1}$ is the channel post-distortion filter applied at every channel Step 2:
Beamspace NLEQ Filter Applied at Every Channel before Digital Beamformer

450 —

$$y[n] = h_0 + \sum_{m_1=0}^{\infty} h_1[m_1]x[n-m_1]$$

Linear System

460 —

$$y[n] = h_0 +$$
$$\sum_{m_1=0}^{\infty} h_1[m_1]x[n-m_1] + \quad \text{— 462} \quad \text{Linear Response}$$
$$\sum_{m_1=0}^{\infty}\sum_{m_2=0}^{\infty} h_2[m_1,m_2]x[n-m_1]x[n-m_2] + \ldots + \quad \text{— 464} \quad 2^{nd}\text{ Order Response}$$
$$\sum_{m_1=0}^{\infty}\ldots\sum_{m_N=0}^{\infty} h_N[m_1,m_2,\ldots,m_N]x[n-m_1]x[n-m_2]\ldots x[n-m_N] + \ldots, \quad \text{— 466} \quad N^{th}\text{ Order Response}$$

Volterra Series

FIG. 4A

$$y_{MP}(n) = \sum_{m=0}^{L} \sum_{k=1}^{K} a_{mk} \cdot x(n-m) \cdot |x(n-m)|^{K-1}$$

$$y_{MP}(n) = \varphi_{MP}(n) \cdot A$$

$$A = [a_{01} \cdots a_{0K}\ a_{11} \cdots a_{1K} \cdots a_{NK}]^T$$

$$\varphi_{MP}(n) = \begin{bmatrix} x(n) \\ x(n) \cdot |x(n)|^{K-1} \\ x(n-1) \\ \vdots \\ x(n-1) \cdot |x(n-1)|^{K-1} \\ \vdots \\ x(n-L) \cdot |x(n-L)|^{K-1} \end{bmatrix}^T$$

$$X = [\varphi_{MP}(n)\ \varphi_{MP}(n-1) \cdots \varphi_{MP}(n-N+1)]^T$$

$$y = [y(n)\ y(n-1) \cdots y(n-N+1)]^T$$

$$A = (X^T X)^{-1} X^T \cdot y$$

L ~ Memory Depth
K ~ Nonlinear Order
N ~ Number of Samples
M ~ Number of Channels

NLEQ Filter Nonlinear Transfer Function $$y[k] = h_0 + \sum_{m_1=0}^{M-1} h_1(m_1)x(k-m_1) + \sum_{m_1=0}^{M-1}\sum_{m_2=0}^{M-1}\sum_{m_3=0}^{M-1} h_3(m_1,m_2,m_3)\, x^*(k-m_1)x(k-m_2)x(k-m_3)$$

x[k] is the input
y[k] is the output
M is the memory depth $F_1 \ldots F_N$ are independent non-linear transfer functions
$G_1^{-1} \ldots G_N^{-1}$ can be independent channel post-distortion filters or instead can all be the same G-1 channel post-distortion filter applied at every channel (FIG. 3C)

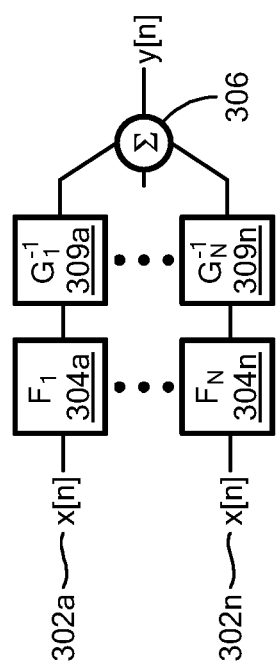

| Parameter | No NLEQ | Case A<br>Ind Gen, Ind App<br>NLEQ | Case B<br>BS Gen, Ind<br>App NLEQ | Case C<br>BS Gen, BS<br>App NLEQ |
|---|---|---|---|---|
| IM3 Suppression | Baseline | ~19 dB better | ~25 + 6.64*log10(N) dB better† | ~22 dB better |
| Coefficient gen calculations | None | Element level | Array level | Array level |
| Filter execution power | None | Element level | Element level | Array level |
| Coefficient storage size | None | Element level | Over beamspace | Over beamspace |

INTERMODULATION SUPPRESSION IN PHASED ARRAYS USING VOLTERRA FILTERS

FIELD

Embodiments of the disclosure generally relate to devices, systems, and methods for signal processing. More particularly, the disclosure describes embodiments relating to devices, systems, and methods for decorrelating third order intermodulation distortion, especially as part of array processing.

BACKGROUND

Transmitted signals can be subject to various transformations and/or distortions along the transmission path or in the circuitry used to receive them. These transformations and/or distortions can be linear or non-linear. In a system such as a radar system or wireless communications system, both the transmit circuits and the receive circuits can include components that can introduce many different kinds of non-linear signal variations, including those that can vary based on frequency, time, and even temperature, including phase and magnitude variations and errors. System nonlinearities introduce various nonlinear distortion products (e.g., harmonics, intermodulations, spurs, etc.) into any system output, and such nonlinear distortion products may limit signal processing's ability to isolate the desired component of the output signal. For example, in a radar system that includes analog-to-digital converters (ADC), the nonlinear distortion generated in the ADCs can limit the capability of a back-end signal processing system to unambiguously detect weak target signals, which can be masked by unwanted non-linear artifacts and other distortion. Reducing such non-linear distortion can help to improve the linear dynamic range of radar receivers and improve overall system performance.

SUMMARY

The following presents a simplified summary in order to provide a basic understanding of one or more aspects of the embodiments described herein. This summary is not an extensive overview of all of the possible embodiments and is neither intended to identify key or critical elements of the embodiments, nor to delineate the scope thereof. Rather, the primary purpose of the summary is to present some concepts of the embodiments described herein in a simplified form as a prelude to the more detailed description that is presented later.

A digital phased array is a phased array antenna where, on transmit, waveforms are generated digitally through the use of a digital-to-analog converter at either the subarray- or element-level and, on receive, received energy is digitized at either the subarray- or element-level. Hence, there are multiple digital receiver/exciter (REX) channels in the composite phased array. On transmit, these exciter channels are sent digital representations of their waveforms. On receive, the digital versions of the receive energy can be digitally combined in arbitrary ways to produce multiple beams with a variety of beam weightings and shapes, limited only by the digital hardware capacity and platform physical limitations. Since the advent of digital phased arrays, the goal of receiver/exciter (REX) design has been to minimize each individual REX channel's requirements while still meeting overall antenna performance. The key to doing so has been using design techniques that decorrelate REX errors from channel-to-channel, resulting in significantly better performance at the array level after all channels have been beamformed. Decorrelation techniques have been developed for all REX errors except those that result from odd-order intermodulation distortion. This work describes, in certain embodiments, a technique that uses nonlinear digital Volterra-based filters to cancel odd-order intermodulation distortion in such a way that the residue of the cancellation is decorrelated from channel-to-channel, resulting in significantly improved performance over alternative approaches.

Suppression of this odd-order intermodulation distortion is also crucial in applications beyond phased array antennas and radar systems, such as communication systems State of the art systems provide additional opportunities for technical advancements, such as suppression of unwanted signals that was previously impractical or impossible.

As Fifth Generation Commercial Cellular (5G) networks come online and enable a massive expansion of the Internet of Things, the number of devices radiating will surge by orders of magnitude. In addition, the criticality of the functions being carried out by the devices—such as self-driving car support—are increasing for a portion of the users, significantly raising Quality of Service requirements. In a phased array, the antenna of choice for most 5G base stations, a driver for Quality of Service is the array's linearity. Another phased array application, radar systems, often operate in environments where the ability to correctly detect and track targets can affect the lives of many—e.g., Federal Aviation Administration (FAA) radar, weather radar, automotive radar, and of course military radar. Such systems need to be resilient to interfering signals. Thus, the issues arising in an environment such as the 5G electromagnetic environment, and many other environments, can begin to approach that of the military battlespace, where jammers (intentional or unintentional) abound, and certain messages carry life or death importance. The aforementioned problems such as interference, harmonics, intermodulation distortion, spurs, etc., can become even more important to mitigate.

Various ways to compensate for distortion in circuits are known in the art, many of which involve the use of Non-Linear Equalization (NLEQ). For example, U.S. Pat. No. 9,705,477, entitled "Compensator for Removing Non-Linear Distortion," states that it provides a "computationally-efficient compensator for removing nonlinear distortion". In another example, commonly assigned U.S. Pat. No. 10,536, 302, entitled, "Beamspace Nonlinear Equalization for Spur Reduction," (hereinafter "'302 patent") states that it relates to, "distortion error correction in array processing" and also mentions, "placement of the NLEQ post-inverse filter in the beamspace portion of an array architecture." In yet another example, an IEEE paper by Peccarelli and Fulton, entitled, "Adaptive Nonlinear Equalization for Digital Array Receivers," (IEEE Transactions on Microwave Theory and Techniques (TMTT); volume 67, No. 11, November 2019), states that it proposes, "an adaptive solution for nonlinear equalization (NLEQ) with the use of the least mean square (LMS) algorithm)". Each of these patents and prior art documents is hereby incorporated by reference.

Expanding use of digital circuitry in many communications, wireless, and radar systems (further enabled by increasing transistor densities predicted by Moore's law) now supports the use of advanced signal processing techniques that can be leveraged to help implement solutions to the problems of interference management.

In one aspect, a method of beamforming is provided. A single non-linear equalization (NLEQ) coefficient set is generated in beamspace, the single NLEQ coefficient set configured to characterize non-linear behavior of a system having an array of N elements. M parallel digital signals are received, for transmission by N channels, respectively, the N channels corresponding to the N elements. Each of the M respective parallel digital signals are equalized, using an NLEQ filter based on the single NLEQ coefficient set, wherein the single NLEQ coefficient set is used for each of the N elements and wherein the equalizing is configured to generate a set of M linearized parallel digital signals. Using a digital summer, the M linearized parallel digital signals are summed, to produce one or more beamspace channelized output signals.

In one embodiment, the equalization is configured to provide at least partial decorrelation between the N channels. In one embodiment, the NLEQ filter is configured to provide non-uniform correction of $3^{rd}$ order intermodulation products in the M parallel digital signals. In one embodiment, the M parallel digital signals include $3^{rd}$ order intermodulation products, and wherein the NLEQ filter is configured so that at least a first portion of the $3^{rd}$ order intermodulation products is approximately 180 degrees out of phase from a second portion of the $3^{rd}$ order intermodulation products.

In one embodiment, the non-uniform correction comprises under-correlation of a first portion of the $3^{rd}$ order intermodulation products and over-correlation of a second portion of the $3^{rd}$ order intermodulation products. In one embodiment, a complex summation of the first portion of the elements roughly equals a negative complex summation of the second portion of the elements, wherein a limit of the complex summation of all intermodulation products for individual frequency bins of the system approaches zero as the number of elements N increases. In one embodiment, the M linearized parallel digital signals that are provided to the summer, includes the first portion of under-correlated $3^{rd}$ order intermodulation products and second portion of over-correlated $3^{rd}$ order intermodulation products, wherein, when the summer adds the first and second portions of $3^{rd}$ order intermodulation products together, the first and second portions cancel each other out to produce at least a partial decorrelation of the M channelized output signals.

In one embodiment, the method further comprises performing a linear transfer function on each of the M parallel digital signals after the equalizing and before the summing. In one embodiment, the method further comprises performing a linear transfer function on each of the M parallel digital signals, before the equalizing. In one embodiment, the method further comprises further comprising serializing the M channelized output signals to produce a linearized signal in beamspace In one embodiment, the NLEQ filter comprises at least one of a Volterra filter and a derivative of a Volterra filter. In one embodiment, M is a nonzero positive number corresponding to a number of outputs of the system, wherein generating the NLEQ coefficient set further comprises applying a measured calibration test signal to the system, and wherein, prior to generating the NLEQ coefficient set, the measured calibration test signal is scaled by M prior to generating the NLEQ coefficient set.

In another aspect, a beamforming system is provided, comprising a processor, a receiver, an equalizer, and a summer. The processor is configured to generate a single non-linear equalization (NLEQ) coefficient set in beamspace, the single NLEQ coefficient set configured to characterize non-linear behavior of a system having an array of N elements. The receiver is configured to receive M parallel digital signals for transmission by N channels, respectively, the N channels corresponding to the N elements. The equalizer is configured for equalizing each of the M respective parallel digital signals, using an NLEQ filter based on the single NLEQ coefficient set, wherein the single NLEQ coefficient is used for each of the N elements and wherein the equalizing is configured to generate a set of M linearized parallel digital signals. The summer is configured to add together the M linearized parallel digital signals, to produce one or more beamspace channelized output signals.

In one embodiment, the M parallel digital signals provided to the equalizer includes 3rd order intermodulation products and wherein the NLEQ filter is configured to provide under-correlation of a first portion of the 3rd order intermodulation products and over-correlation of a second portion of the 3rd order intermodulation products. In one embodiment, the M linearized parallel digital signals that are provided to the summer, includes the first portion of under-correlated 3rd order intermodulation products and the second portion of over-correlated 3rd order intermodulation products, wherein, when the summer adds the first and second portions of 3rd order intermodulation products together, the first and second portions cancel each other out to produce at least a partial decorrelation of the M channelized output signals. In one embodiment, the NLEQ filter comprises at least one of a Volterra filter and a derivative of a Volterra filter.

In another aspect, a non-linear equalization system is provided, comprising a processor, an equalizer, and a summer. The processor is configured to generate a single non-linear equalization (NLEQ) coefficient set configured to characterize non-linear behavior of a system having N channels. The equalizer is configured for equalizing each of the N respective parallel digital signals that are received at the N channels, using an NLEQ filter based on the single NLEQ coefficient set, wherein the single NLEQ coefficient set is used for each of the N channels, and wherein the equalizing is configured to generate a set of N linearized parallel digital signals. The summer is configured to add together the set of N linearized parallel digital signals.

In one embodiment, the M parallel digital signals provided to the equalizer includes 3rd order intermodulation products, wherein the NLEQ filter is configured to provide under-correlation of a first portion of the 3rd order intermodulation products and over-correlation of a second portion of the 3rd order intermodulation products. In one embodiment, the M linearized parallel digital signals that are provided to the summer, includes the first portion of under-correlated 3rd order intermodulation products and the second portion of over-correlated 3rd order intermodulation products, wherein, when the summer adds the first and second portions of 3rd order intermodulation products together, the first and second portions cancel each other out to produce at least a partial decorrelation of the M channelized output signals. In one embodiment, the NLEQ filter comprises at least one of a Volterra filter and a derivative of a Volterra filter.

Details relating to these and other embodiments are described more fully herein.

BRIEF DESCRIPTION OF THE DRAWINGS

The advantages and aspects of the described embodiments, as well as the embodiments themselves, will be more fully understood in conjunction with the following detailed description and accompanying drawings, in which:

FIG. 2 is a table summarizing common types of receiver errors and whether they can be decorrelated in a phased array implementation using known approaches, where this technique can be used to decorrelate third-order intermodulation, in accordance with one embodiment;

FIG. 4A is an illustration showing an exemplary mathematical equation for a linear system and exemplary mathematical equations for several Volterra Series, in accordance with one embodiment;

FIG. 4B is an illustration showing exemplary mathematical operations and memory polynomial structure for simplification of a Volterra series, in accordance with one embodiment;

FIG. 4C is an exemplary NLEQ filter nonlinear transfer function and simplified block diagram of a transfer function for NLEQ where an identical beamspace NLEQ filter is independently applied on each element in an array, in accordance with one embodiment;

FIG. 8A is a first exemplary chart summarizing and comparing three approaches of applying non-linear equalization (NLEQ), in accordance with one embodiment;

FIG. 12 is an exemplary table summarizing simulation results and other performance information for the three approaches of FIGS. 8A and 8B, in comparison to an approach with no NLEQ, in accordance with one embodiment.

The drawings are not to scale, emphasis instead being on illustrating the principles and features of the disclosed embodiments. In addition, in the drawings, like reference numbers indicate like elements.

DETAILED DESCRIPTION

Figure 1:
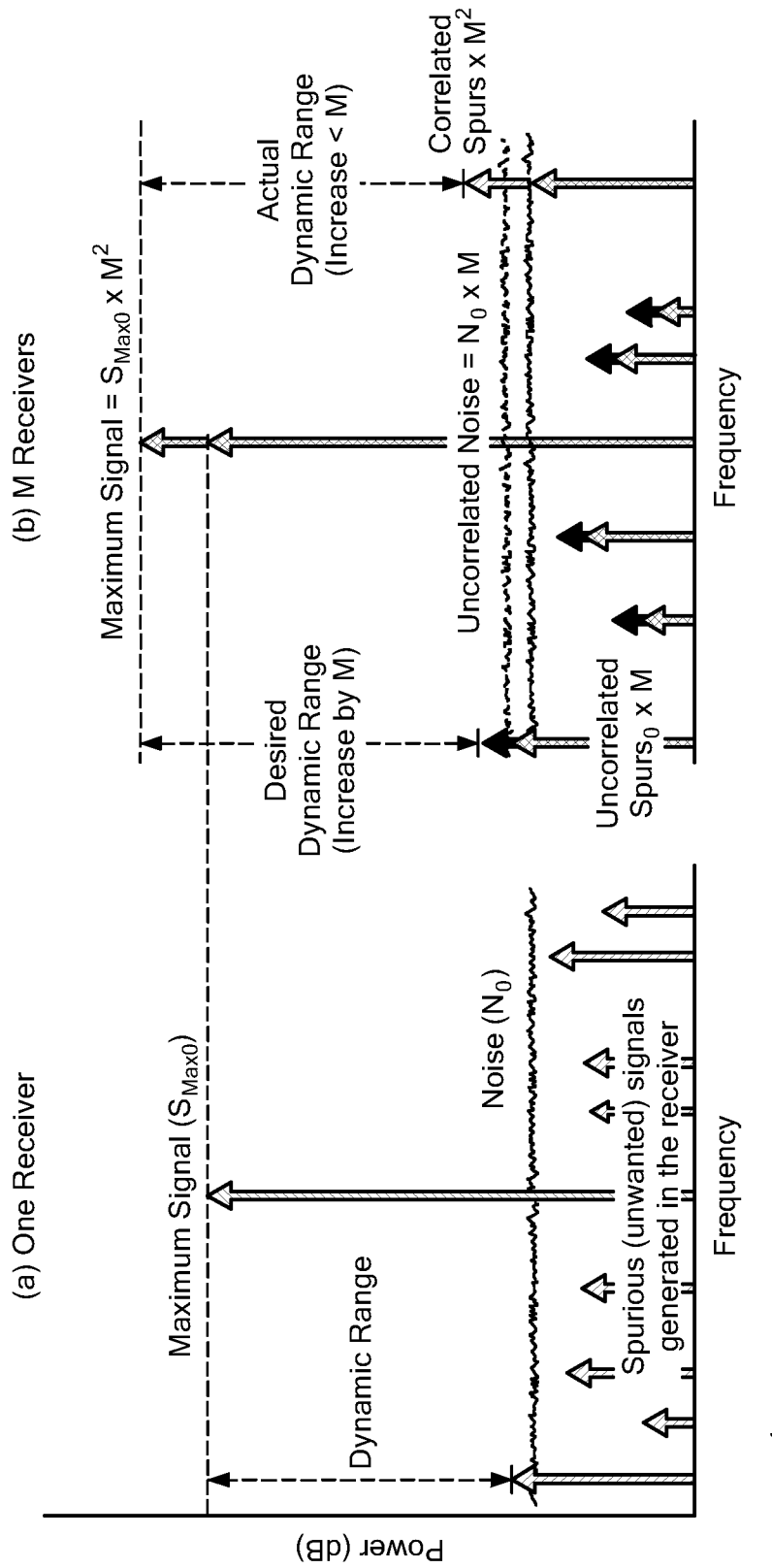
FIG. 1 is a simplified graph comparing dynamic range and spur behavior in a single receiver (left) vs multiple parallel receivers (right) architectures and the dynamic range improvements that come from summing together spurs or noise that are uncorrelated (or have been decorrelated using some technique), in accordance with one embodiment.

The following detailed description is provided, in at least some examples, using the specific context of target detection systems (e.g., phased array radar systems) configured to detect, track, monitor, and/or identify targets, where targets can include (but are not limited to) aircraft (both unmanned and manned), unmanned aerial vehicles, unmanned autonomous vehicles, robots, ships, spacecraft, automotive vehicles, and astronomical bodies, or even birds, insects, and weather (e.g., rain and storms, etc.). However, the embodiments described herein are not limited to applications in this context. Those of skill in the art will appreciate that the embodiments described herein are applicable to many types of systems, including but not limited to wireless communications of all kinds, vehicle automation and/or self-driving car support, factory automation, laboratory test equipment, medical imaging, audio and video compression, any systems that include digital transceivers, and any systems subject to signal interference. In addition, in explaining systems with nonlinear behavior, for purposes of simplicity, the example of a receiver system is discussed. As will be appreciated, however, the techniques and arrangements discussed herein can have applicability to any system that exhibits nonlinear behavior, including but not limited to biological systems, fluid flow systems, optical systems, imaging systems, RF receiver and transmitter systems, magnetic devices and magnetic recording systems, analog electronic systems, amplifier systems, loudspeaker systems, radar systems, etcetera.

In addition, it is noted that various connections are set forth between elements in the following description and in the drawings (the contents of which are included in this disclosure by way of reference). These connections in general and, unless specified otherwise, may be direct or indirect and that this specification is not intended to be limiting in this respect. In this disclosure, a coupling between entities may refer to either a direct or an indirect connection. It should be understood that throughout the drawings, corresponding reference numerals indicate like or corresponding parts and features. As used herein, the term module, unit and/or element can be formed as processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

Additionally, use of the term "signal" in conjunction with this disclosure is not limited to analog and/or digital signals but rather is meant to denote as well (1) the mathematical description of any measurable phenomena in nature or in human-made systems and (2) the mathematically described function of one or more variable depending on one or more parameters. Examples of types of signals which are encompassed in the embodiments described herein include, but are not limited to, light intensity, voltage, pressure, electromagnetic radiation (including radio waves), magnetic field strength and electric field strength.

A digital-array radar can be based on a phased array antenna in which transmitted waveforms are generated digitally at each element and the received energy is also digitized at each array element. Being able to generate digital waveforms and digitize received energy provides several advantages, such as enabling transmit and receive beams of arbitrary weighting and shape to be formed in the digital domain in any direction and enabling the formation of multiple simultaneous receive beams, their number and instantaneous bandwidth, and dynamic range being limited only by the data converters and the digital hardware capacity and power consumption, without a signal-to-noise ratio penalty. Digital phased arrays also provide adaptive null steering and easy of calibration. One type of a digital phased array is an element-level digital array, where there is a transceiver at each element of the array and where beamforming is greatly simplified and much more flexible. In an element-level digital array, phase and amplitude weights are applied by digital operations and beamforming is performed by digital summations across the array. Having each antenna element have its own transmit and receive channels allowing for easy scalability based on the number of antenna elements; with each antenna element requiring its own transceiver, components used to build the array advantageously are low cost and have low complexity, to help keep the system cost reasonable. However, lower cost and low complexity components can tend to be more non-linear, which can result in problems such as intermodulation distortion (IMD), harmonic distortion, cross modulation, and compression, as described further below.

Another evolution in systems architectures such as radar architectures, has been an ever-growing distribution of functions and hardware throughout the system. Thanks to technological advances, receiver and waveform generation functions can now be distributed across the array and placed either behind analog-beamformed sub-arrays or directly behind radiating elements. For example, many modern digital radars use distributed receivers, where each receiver is exposed to only a fraction of the total signal that the array sees. In contrast to an analog phased array (which is assumed to have just one receiver), the theoretical maximum dynamic range of a digital architectures with distributed receivers will be that of one receiver multiplied by the number of receivers (e.g., M receivers), assuming that the noise and spurs are decorrelated among the receivers in the system. Digital arrays with M receivers normally would be expected to have a 10 log (M) gain in the signal-to-noise ratio (SNR), which is present in digital arrays with M receivers, but any non-linearities in the receivers can correlate during beamforming, which can eliminate the 10 log (M) gain. Thus, although digital arrays enable the use of lower cost, lower dynamic range receivers to meet the required system-level dynamic range, it is advantageous if system non-linearities are mitigated, as described herein, to optimize operation of the digital arrays.

FIG. 1 is a simplified graph 100 comparing dynamic range in analog array systems with one receiver (left) to that of digital arrays having M multiple parallel receivers (right), in accordance with one embodiment (assuming that the same receiver is used in both the analog array and the digital array). FIG. 1 is adapted from a figure in the paper "Benefits of Digital Phased Array Radars" written by Salvador Talisa, et al., appearing in Proceedings of the IEEE, Vol. 104, No. 3, March 2016 (hereinafter "Talisa paper"). Note, however, that FIG. 1 shows possible issues with the arrangement of M receivers, including that the distributed M receivers also can be associated with noise and spurs that may or may not be able to be decorrelated using known techniques, as shown in FIG. 2, which is a table 200 summarizing common types of receiver errors and whether the errors can be decorrelated using known approaches, in accordance with one embodiment. FIG. 2 also is adapted from the Talisa paper.

Referring to FIGS. 1 and 2, each receiver (in a group of M distributed receivers) is required to have a certain performance level, to be able to achieve a desired performance level and dynamic range. Receivers with lower performance may have higher spurs limiting their dynamic range. If used in a digital array, however, various techniques have been developed to ensure that certain receiver errors like mixer spurs or analog-to-digital converter (ADC) harmonics are decorrelated, as mentioned above in connection with the table 200 of FIG. 2. Thus, each individual receiver's "required" performance can be reduced (enabling use of lower cost and/or lower performing receivers) if it is possible to decorrelate performance-limiting errors. Such error decorrelation allows lower-performance receivers to meet system-level performance requirements after beamforming. However, the table 200 of FIG. 2 shows that $3^{rd}$ order intermodulation distortion is the only major receiver error source for which there has been (prior to this disclosure) no established decorrelation technique. As will be described further below, although FIG. 2 indicates that "conventional" and known techniques are not able to decorrelate $3^{rd}$ order intermodulation, at least some novel embodiments described herein are able to provide decorrelation of $3^{rd}$ order intermodulation products.

Intermodulation Distortion (IMD) occurs when two or more signals are used in a system that includes non-linearities. In such a system, the spectrum at the output of, e.g., a component that is non-linear or that has non-linear behavior, includes not just the original signals but also contains the sums and differences of integer multiples of the input signals along with their harmonics. For example, if a system with non-linearities ("non-linear system") has two signals at its input, notionally at frequencies $f_1$ and $f_2$, then the non-linear system behavior gives rise to other output signals at various frequencies, some of which are known as intermodulation products. Odd-order intermodulation products are those that appear at $m \cdot f_1 \pm n \cdot f_2$, where m and n are integers, such that the sum of m and n (m+n) is odd. $3^{rd}$ order intermodulation products (also referred to herein as "IM3") are those for which the sum m+n is equal to 3. Odd-order intermods can be particularly problematic because they are close in frequency to the original signal and thus can generally not be filtered out. The $3^{rd}$ order intermod products are often the largest odd-order intermod products.

Even if the intermods have low energy levels, if the intermods fall in the receiver band where signals may be present, intermods can be a significant barrier to detect weak signals in the presence of strong signals. Moreover, because signal processing techniques often attempt to detect smaller and smaller signals, intermods and other distortions have the potential to hide signals of interest. A number of analog and digital compensation techniques have emerged to "nullify" those signal distortions. For example, in the analog realm, compensation has included such as radio frequency (RF) components biased at a higher voltage (which generally which also consumes more power) and/or using higher quality components. In the digital realm, compensation can include certain coding and decoding that is configured to lessen the intermods and/or equalizing algorithms and/or circuits that filter the nonlinear effects.

Because many conventional/classical linear filtering approaches are ineffective to alleviate non-linear distortion, such as intermods, other approaches have been developed. In some of these conventional linear systems, the system using the transmitted and received signals attempts to "equalize" the signal; that is, to compensate for, or even invert, the distortions, to improve ability to extract information from the received signal. Equalization makes the frequency response of a channel flat (i.e., no distortion) across the bandwidth under consideration. In an equalization operation, the frequency domain attributes of the desired signal at the input of the channel are reproduced at the output of the channel. Equalization is widespread—many types of systems (including but not limited to radars, telephones, DSL lines, and television cables) use equalizers to prepare data signals for transmission.

A linear equalizer applies the inverse of the channel frequency response to the received signal to restore the signal after it leaves the channel. Although linear equalizers are simple to construct, they cannot be used to correct nonlinear distortion effects. Linearity can be a difficult requirement to meet in radio frequency (RF) systems. Various types of linearization have been used to attempt to reduce or compensate for linearities, including digital linearization solutions such as Digital Pre-Distortion (DPD) (used for transmitters) and Nonlinear Equalization (NLEQ) (used for receivers). For example, one equalization approach involves applying an adaptive nonlinear polynomial filter to the system to attempt to reduce the distortions by inverting the nonlinear system response without harming the desired linear input-signal component. One difficulty has been that some implementations of polynomial filters had required a prohibitive number of computations and were viewed as impractical in systems requiring real-time response. Thus, it has been desirable to minimize the complexity of these types of filters when used.

Figure 3A:
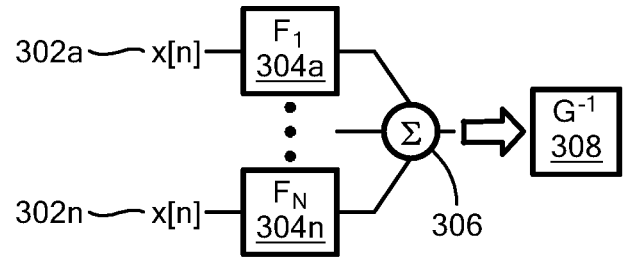
FIG. 3A is an illustration of a simplified block diagram visualizing an example M-channel phased array receive system, where one beamspace NLEQ filter is generated for the entire array after digital beamforming, in accordance with one embodiment.

NLEQ filters are nonlinear polynomial filters used to cancel distortions generated by RF frontend components and data converters. FIG. 3A is a first exemplary simplified block diagram 300 of an exemplary transfer function for non-linear equalization (NLEQ), where one beamspace NLEQ filter is generated for the entire array, in accordance with one embodiment. Referring to FIG. 3A, each of a set of input signals x[n] 302a-302n is associated with a respective parallel channel and with a respective independent non-linear transfer function $F_1$ 304a through $F_N$ 304b, respectively, to represent the non-linear frequency response of the respective channels x[1] through x[n], respectively, such as randomized gain, phase, and non-linear effects on each channel (represented by the individual transfer functions $F_1$ through $F_N$). In certain embodiments, it is assumed that the parallel channels in the array architecture (associated with FIG. 3A) are of identical construction and therefore have similar (though not identical due to manufacturing tolerances and design process variation) non-linear behavior per each channel, and that the input power range is limited so that the $Power_{out}$ vs $Power_{in}$ trend is monotonically increasing over the input power range.

In certain embodiments, the slight variations in the non-linear behaviors of each channel are what enable the advantageous decorrelation effect that is discussed further herein. The global NLEQ filter 308 that is used on each channel (e.g., as shown in FIG. 3C, discussed further herein), undercancels the 3rd-order intermods in some channels and over-cancels them in others. This nonuniform correction results in the residues of the over-cancelled 3rd-order intermods having phases that are 180° degrees out of phase from the under-canceled intermods. In certain embodiments, this phase scrambling of roughly half of the channels is what causes the intermods' phase to become partially decorrelated. This partial decorrelation results in the intermods cancelling each other when they are added together (e.g., via adder 406 of FIG. 3C, discussed further herein) during the digital beamforming step (as also shown in FIG. 3D discussed further herein).

Figure 3B:
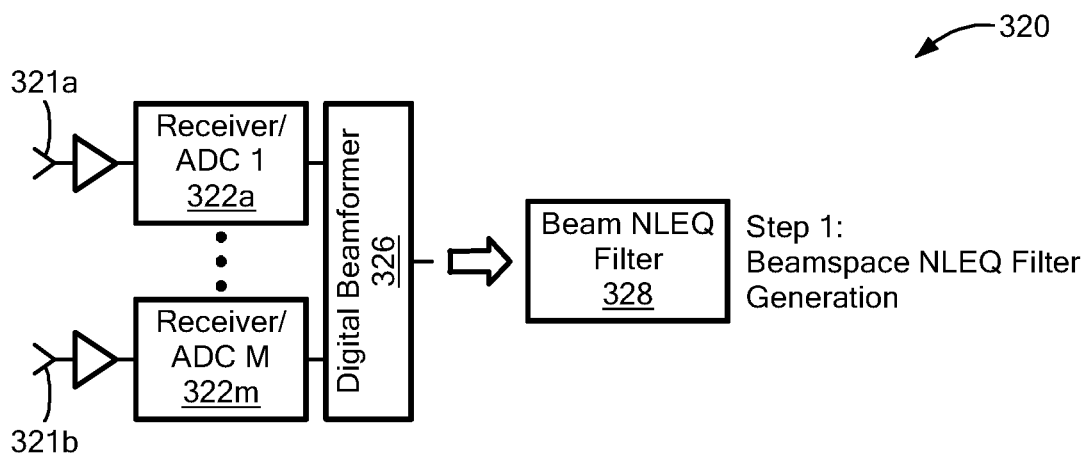
FIG. 3B is an illustration of a simplified block diagram showing a first step of beamspace NLEQ filter generation, as part of using NLEQ in a phased array radar, in accordance with one embodiment.
Figure 3C:
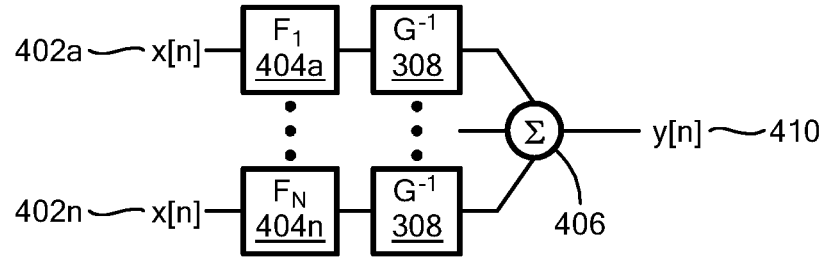
FIG. 3C is an illustration of a simplified block diagram visualizing an example M-channel phased array receive system, where the one beamspace NLEQ filter generated in the process shown in FIG. 3A is applied at each element in the array during tactical system usage, in accordance with one embodiment.
Figure 3D:
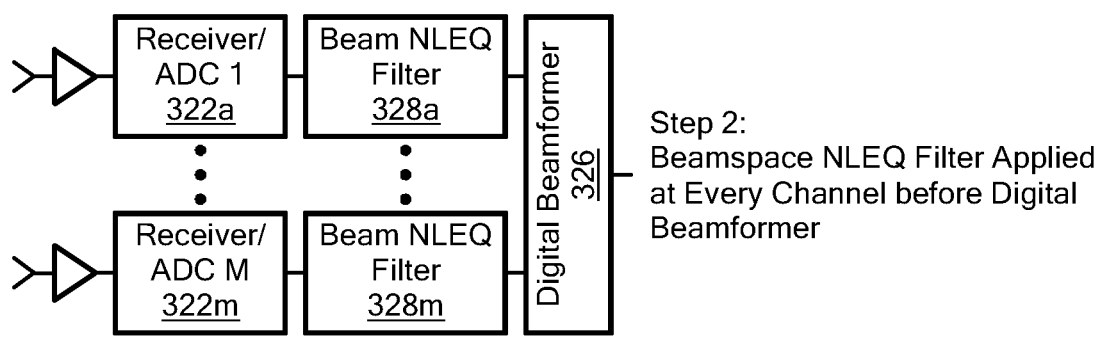
FIG. 3D is an illustration of a simplified block diagram showing a second step of applying a beamspace NLEQ filter at every channel, before providing to digital beamformer, as part of using NLEQ in a phased array radar, in accordance with one embodiment.

Referring still to FIG. 3A, the output of each non-linear transfer function $F_1$ to $F_N$, is added together by a summer 306, which is representative of the digital beamforming process, as shown in FIG. 3B, which is an illustration of a simplified block diagram 320 showing a first step of beamspace NLEQ filter generation, as part of using NLEQ in a phased array radar, in accordance with one embodiment. In FIG. 3B, the Receiver/ADC block 322 is one of a plurality of channels each receiving input from a respective antenna element 321. FIG. 3B represents similar information as FIG. 3A, but it shows the system elements where the functionality of FIG. 3A is being implemented. In certain embodiments, the output of the summer 306 (e.g., digital beamformer 326) is used to generate a single beamspace NLEQ filter $G^{-1}$ 308 (shown as Beam NLEQ filter 328 in FIG. 3B) for the entire array, which corresponds to an overall post-distortion filter for the array (this is described further herein in connection with FIG. 5C, which is an exemplary simplified system block diagram for generation of an NLEQ filter in a system implementing the transfer function of FIG. 3B 4 (described further herein), using the transfer function of FIG. 3A, in accordance with one embodiment).

The aforementioned and incorporated by reference '302 patent includes techniques for generating a beamspace NLEQ filter, for example, and, in certain embodiments, these techniques are likewise applied in FIG. 5C to generate the beamspace filter 308 of FIG. 3A, which is used in at least some embodiments herein (as discussed further below, along with further discussion on computing NLEQ coefficients and simplifying Volterra series). FIGS. 5A-7B, discussed further herein, depict a system block diagram and related methods for generating and applying NLEQ coefficients in beamspace and an NLEQ filter, in accordance with at least some embodiments.

FIG. 4A is an illustration showing an exemplary linear system mathematical equation 450 and exemplary mathematical equations 462, 464, 466, for several Volterra Series, in accordance with one embodiment. FIG. 4B is an illustration showing exemplary mathematical operations and memory polynomial structure for simplification of a Volterra series, in accordance with one embodiment; FIG. 4C is an illustrative example of an exemplary NLEQ filter nonlinear transfer function 350, and a simplified block diagram 360 of a transfer function for NLEQ where an identical beamspace NLEQ filter is used on each element in the array, in accordance with at least one embodiment, as part of its equalizer. In certain embodiments discussed further below, NLEQ is performed using nonlinear filters (e.g., having the exemplary transfer function 350) that are based on the Volterra series, a generalization of Taylor Series that includes a higher-order extension of the memory effects seen in a linear system's impulse response. As is known, a Volterra series comprises a non-recursive series in which the output signal is related to the input signal as follows in equation (1) (which can correspond to a so-called discrete "truncated" Volterra series expansion:

$$y[n] = \sum_{r=0}^{N} \sum_{k_1=0}^{M-1} \ldots \sum_{k_r=0}^{M-1} h_r[k_1, \ldots k_r]x[n-k_1] \ldots x[n-k_r] \quad (1)$$

In equation (1) above, N represents the model nonlinearity degree, M is the filter memory and the coefficients $h_r[k_1, \ldots k_r]$ is the rth order Volterra kernel. Each component of the kernel is a coefficient, also called weight, for one term in the expansion, and each of these weights should be "trained" to model a given system. An illustrative example and description of training a system that includes Volterra filters is found in U.S. Pat. No. 6,351,740, entitled, "Method and system for training dynamic nonlinear adaptive filters which have embedded memory," which is hereby incorporated by reference. In the most general case Eq.(1) can use different memory for each nonlinearity order. As is understood, the Volterra series expansion effectively is a linear combination of nonlinear functions of the input signal.

Choosing N=3 in the Eq.(1), an input-output relationship of the third order Volterra filter can be expressed as shown in equation (2) below:

$$y[n] = \quad (2)$$
$$h_0 + \sum_{k_1=0}^{M-1} h_1[k_1]x[n-k_1] + \sum_{k_1=0}^{M-1}\sum_{k_2=0}^{M-1} h_2[k_1, k_2]x[n-k_1]x[n-k_2] +$$
$$\sum_{k_1=0}^{M-1}\sum_{k_2=0}^{M-1}\sum_{k_3=0}^{M-1} h_{r3}[k_1, k_2, k_3]x[n-k_1]x[n-k_2]x[n-k_3]$$

The nonlinear model described by the equations (2) above can be referred to as a third order Volterra model. In addition, in equation (2), there is the same memory for all nonlinearity orders. Algorithms driven by the Volterra series include the Least Mean Square (LMS) Volterra Filter and the Recursive Least Square (RLS) algorithms; it is presumed that one of skill in the art is familiar with these and they are not repeated here; moreover, an application of the LMS algorithm is described in the aforementioned '302 patent.

In certain embodiments, the NLEQ filters 328 (FIGS. 3B, 3D) are based on the Volterra series, which is an extension of the linear impulse response to higher orders. The Volterra series can be used to model or invert weakly nonlinear systems and cancel intermodulation distortion while not affecting the desired fundamental signals. Historically, Volterra series have been challenging to implement in a practical system, although experimental approaches have shown 15-20 dB of linearity improvement when implemented. One challenge has been that this approach can require a large number of filter coefficients and multiply-accumulates, which can lead to non-negligible power consumption. In addition, in some implementations, substantial training is required to provide cancellation across frequency, temperature, waveform type, etc.

FIG. 4C is an exemplary NLEQ filter nonlinear transfer function 350 and simplified block diagram 360 of a transfer function for NLEQ. In some embodiments, an identical beamspace NLEQ filter is independently applied on each element in an array, in accordance with one embodiment (that is, the same $G^{-1}$ filter is applied at each element, as shown explicitly in FIG. 3C). In some embodiments, as well, there can be independent filters applied, as shown in the block diagram 360 (the $G_1^{-1}$ to $G_N^{-1}$ in the block diagram indicates that each filter is independent). The exemplary transfer function 350 of FIG. 4C corresponds to an exemplary adaptation of the third order Volterra series expansion of equation (2) above, in accordance with certain embodiments, exemplary $3^{rd}$ order Volterra series expansion for y[k] in a system where x[k] is an input signal, and y[k] is an output signal, of a discrete time and causal non-linear system with memory. In the transfer function 350, the given $h_p$ [m1, m2, m3] is known has the $p^{th}$ order Volterra kernel of the system (where in the example of the transfer function 350 is a generalized $3^{rd}$ order expansion). In the filter 350 M represents the filter memory depth. In the transfer function 350, the filter output y[k] is the sum of the outputs of the linear filter part and the nonlinear filter part, as will be understood. As is shown in FIGS. 4A and 4C and as will be understood by those of skill in the art, in practical implementations of the transfer function, the even-order kernels are generally zeroed out because they cannot cancel odd-order distortions. Zeroing out the even order kernels is a way of simplifying the Volterra kernel so that it is less computationally expensive. Thus, although equation (2) above shows all kernels, including even-order kernels, it can be advantageous in at least some embodiments herein to ignore the even-order terms.

As will be appreciated by those of skill in the art, there are numerous ways known in the art to calculate the optimal NLEQ coefficients. In certain embodiments, one technique that is usable is in Section 8.4.2 Model Coefficient Extraction Techniques in the book *Behavioral Modeling and Predistortion of Wideband Wireless Transmitters* by Ghannouchi, Hammi, and Helaoui, published by John Wiley & Sons, 2015, but use of this technique is not limiting. This technique describes one standard approach known in the art where output of the polynomial filter (for example, a memory polynomial) is written as a linear function of the coefficients and the matrix that relates them is a nonlinear function of samples of the input signal. For example, reference is now made to FIG. 4B, which is an illustration showing exemplary mathematical operations and memory polynomial structure for simplification of a Volterra series, in accordance with one embodiment. Formulating the system in this way allows classical linear signal processing techniques to be used to determine how to provide an optimal (in the minimum mean squared error sense) solution for the coefficients by calculating a pseudoinverse.

In certain embodiments, simplification of the Volterra series, as described herein, can help to reduce the complexity of implementation. With simplification, there are a reduced number of coefficients representing only diagonal elements of Volterra filter kernels. A simplified Volterra series can be represented efficiently in matrix form. Thus, in at least some embodiments herein, the simplified Volterra series is used in the NLEQ decorrelation algorithm for its simplicity and small number of terms. In addition, in certain embodiments herein, the NLEQ filters described herein can be formed using or based on a Volterra filter or one of its derivatives.

NLEQ filters, in accordance with at least some embodiments herein, can be used to model and invert compression and distortion effects seen in weakly nonlinear systems, such as those used in wireless communication circuits. NLEQ-based algorithms have been shown to substantially reduce spurs, but only if the NLEQ is performed on every individual channel, as shown in the simplified block diagram 400 of FIG. 3C, which applies to respective inputs x[n] to each of n channels (302*a*-302*n*). FIG. 4C also states that, in certain embodiments, that $G_1^{-1}$ through $G_N^{-1}$ are each a respective independent non-linear transfer function $G^{-1}$ (309*a* through 309*n*), in accordance with one embodiment. However, computing NLEQ coefficients for each channel can be computationally complex, as will be understood.

It is possible to use a single channel to determine the NLEQ coefficients that would be applied to every channel, but this approach can tend to be less optimal for large arrays and less accurate than at least some approaches described herein. For example, at least some embodiments herein provide a more accurate approach for NLEQ coefficient estimation. In accordance with at least one approach herein, the NLEQ coefficient generation process includes a step of summing every channel first, which results in a better signal-to-noise ratio, and thus a more accurate NLEQ coefficient estimation. Although summing every channel first might require generation of NLEQ coefficients for multiple beam-pointing angles, it still provides greater accuracy than other approaches for NLEQ coefficient generation.

Note that, in some other approaches, as noted for the block diagram 360 of FIG. 4C, each respective $G^{-1}$ filter is independent of each other filter (that is, must be independently computed). However, performing NLEQ on each channel 302*a*-302*n*, in this way especially if each respective $G^{-1}$ filter must be independent and unique (e.g., corresponding to "Case A" discussed further herein in connection with FIG. 8 herein), can create a substantial amount of input/output (I/O) and real time processing that is preferred to be mitigated and moved to the backend processing. Thus, in some embodiments, as discussed further herein, the $G^{-1}$ channel post distortion filter can instead be the same filter applied at every channel, such that it only has to be computed once, then applied to each element in an array, as shown in FIGS. 3A-4D and also described for FIG. 4C. FIG. 4C includes is an exemplary NLEQ filter nonlinear transfer function and FIG. 3C includes a simplified block diagram 400 of a transfer function for NLEQ where an identical beamspace NLEQ filter $G^{-1}$ (309*a*-309*m*) is used on each element in an array, in accordance with one embodiment. This is also discussed further herein in connection with FIGS. 5A-7B.

Referring to FIG. 4C, similar to FIGS. 3A and 3C, each of a set of input signals x[n] 302*a*-302*n* is associated with a respective parallel channel and with a respective independent non-linear transfer function $F_1$ 304*a* through $F_N$ 304*b*, respectively, to represent the non-linear frequency response of the respective channels x[1] through x[n], respectively, such as randomized gain, phase, and non-linear effects on each channel (represented by the individual transfer functions $F_1$ through $F_N$). Similar to FIGS. 3A and 3C, in certain embodiments, it is assumed that the parallel channels in the array architecture (associated with FIG. 4C) are of identical construction and therefore have similar (though not necessarily identical) non-linear behavior per each channel. As will be discussed further herein, an identical beamspace NLEQ filter $G^{-1}$ 308 is used on each element in the array and is applied as a plurality of independent $G^{-1}$ filters, to each element/channel. In certain embodiments, the beamspace NLEQ filter $G^{-1}$ 308 of FIG. 3A (and FIG. 3C), is the same one computed in FIG. 3A. That is, in certain embodiments, NLEQ coefficients are computed on the beamformed output of the array (see FIGS. 5A-6 discussed further herein) but then NLEQ filters with the beamformed coefficients are implemented at the individual channel (see FIGS. 4C, 5, and 7 herein), where the same NLEQ filter is used on each channel. In certain embodiments, this approach enjoys the high signal-to-noise ratio (SNR) benefits of the beam space approach but also results in an additional advantage of significant decorrelation among the channels in the full phased array (that is, the decorrelation increases the more elements in the array, as discussed further herein). This decorrelation leads to improved IMD rejection as compared against the beamformed approach.

In accordance with at least some embodiments described herein, certain receiver non-linear equalization (NLEQ) techniques and NLEQ decorrelation techniques can provide one effective way to mitigate IMD, helping to maintain and/or increase the dynamic range and linearity of some types of systems. In the aforementioned 5G environment, with its higher data rates, it can be necessary to use all possible techniques, including NLEQ, to mitigate non-linearities and IMD that can result if strong blocker signals are present in the 5G environment, especially if the spectral environment is saturated. Even small improvements in rejection of $3^{rd}$ order intermods, can be very useful. NLEQ decorrelation, as discussed further herein, helps to enable the interference mitigation required to maintain excellent Quality of Service in more challenging electromagnetic environment, such as the 5G environment. NLEQ decorrelation that is applied as described herein (generated in beamspace and applied at element level) can provide a very effective method of mitigating 1 MB, where mitigating IMD can extend the dynamic range (DR) and linearity of low-cost systems, even wireless systems such as multiple input multiple output (MIMO) systems.

The U.S. Dept of Defense (DoD) currently has a Millimeter-Wave Digital Arrays (MIDAS) program, where one goal is to create the digital array technology that will enable next-generation DoD millimeter wave systems. MIDAS seeks to develop element-level digital beamforming that will support emerging multi-beam communications and directional sensing of the electromagnetic environment in the 18-50 GHz band. In one example, Raytheon Corporation of Waltham, Mass., has developed sophisticated element-level digital arrays in connection with its work on the MIDAS program. This work includes providing NLEQ filters in the application-specific integrated circuits (ASICs) that the element-level digital arrays use for equalization and beamforming. These NLEQ filters, nonetheless, have been minimally used thus far due to the complexity involved in training them properly to perform cancellation over broad frequency and temperature ranges and the power consumption required to run them.

However, in certain embodiments, as discussed further herein, a technique is provided that generates and implements NLEQ filter coefficients after beam forming, then applies them at element level (e.g., as shown and described herein in connection with FIGS. 4-7). It has been found that, in some embodiments, this approach can outperform an arrangement where NLEQ coefficients are generated and implemented at each channel or where a single NLEQ filter is applied to an entire array in beamspace (see simulations herein in FIGS. 8-12. At least some embodiments herein attempt to resolve at least some of the previously discussed concerns regarding the problems of intermodulation distortion. In at least some embodiments, an approach is described that expands further on an approach that Raytheon developed on DARPA MIDAS. In one embodiment, the NLEQ coefficients are calculated on the beamformed output of the array, but then NLEQ filters are implemented with the beamformed coefficients implemented at the individual channel, which as noted previously enables significant decorrelation among the channels in the full phased array, and improved suppression/rejection of IMD.

In certain embodiments described further herein, Volterra nonlinear equalization (NLEQ) filters are used to decorrelate third-order intermodulation, including in devices such as receivers. In certain embodiments, methods and systems are provided that generate NLEQ coefficients in beamspace but apply them at an element level, to provide a way to decorrelate intermodulation distortion. Generating NLEQ filter coefficients in beamspace results in a higher-SNR measurement and a single coefficient calculation process, where the single coefficient is then applied at every element. In certain embodiments, applying the beamspace NLEQ filter at every element results in the intermod residue having a phase that is shifted by 180° for approximately half of the elements, as discussed further herein. In certain embodiments, due to magnitude variation between intermodulation products, the approximate half of the elements can be more accurately expressed as the complex summation of a first portion of the elements roughly equals the negative complex summation of a second portion of the elements, so that the limit of the complex summation of all intermodulation products for individual frequency bins of the system approaches zero as the number of elements N increases. This can enable gains in dynamic range gain from array scaling/decorrelation, which may approach 10 log 10(N) dB). In certain embodiments, this decorrelation credit can be traded to improve receive linearity or decrease receive DC power consumption. For example, as will be understood, each receiver could be configured to be less linear (and hence use less DC power) and still get to the overall system linearity requirement through the decorrelation. Alternatively, each receiver's linearity can be held at the same level (and same DC power) to get better overall system linearity. In certain embodiments, as explained further herein, it is projected that the distributed beamspace NLEQ decorrelation techniques described herein can improve receiver linearity by ~30 dB for 1000-channel arrays. In addition, the technique of generating NLEQ coefficients in beamspace, but implementing them at the element level, can help to solve a fundamental shortcoming of element-digital phased arrays in challenging interference environments.

Figure 5A:
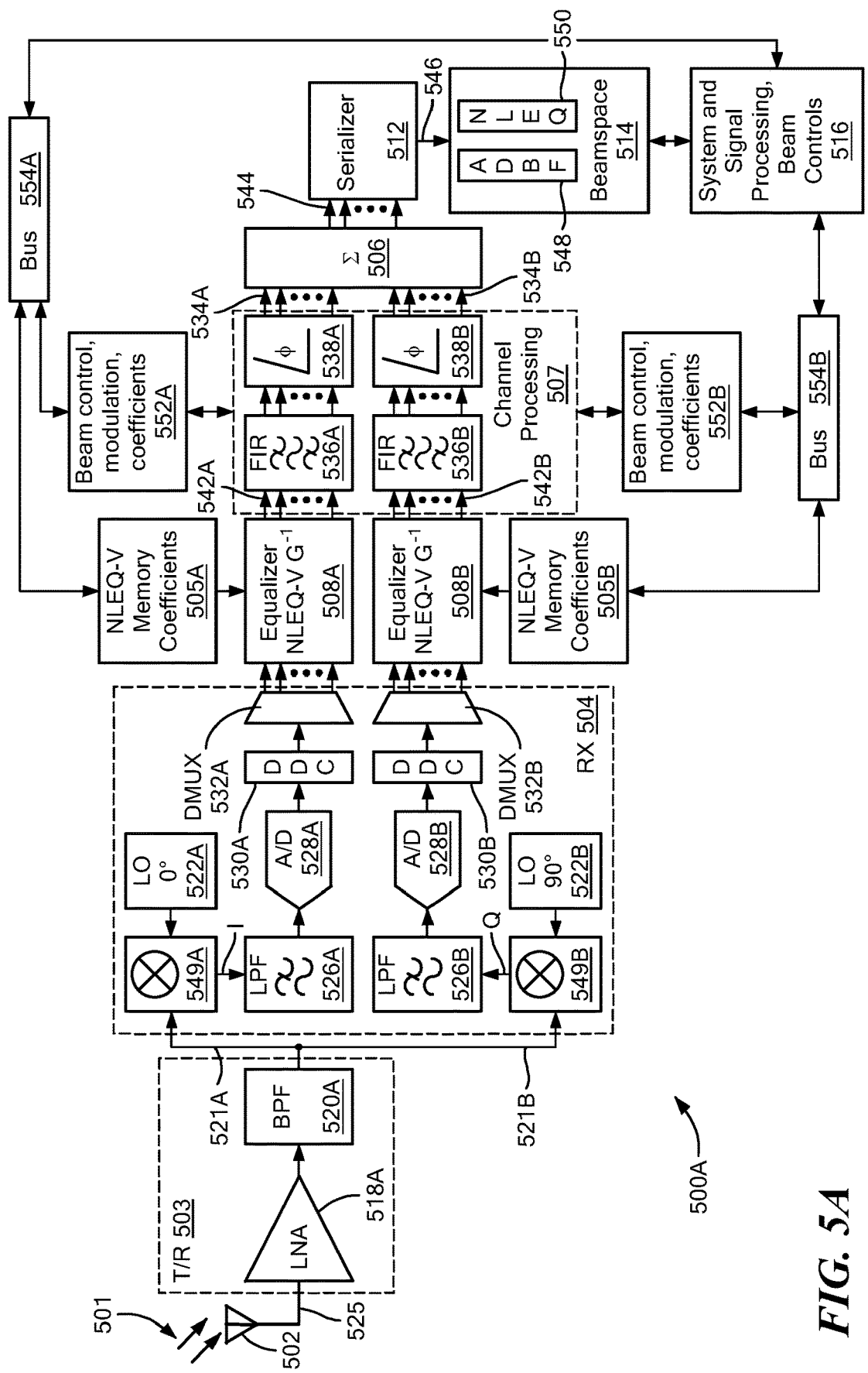
FIG. 5A is a first exemplary simplified system block diagram for application of an NLEQ filter in a system implementing the transfer function of FIGS. 3C and 4C, in accordance with one embodiment.
Figure 5B:
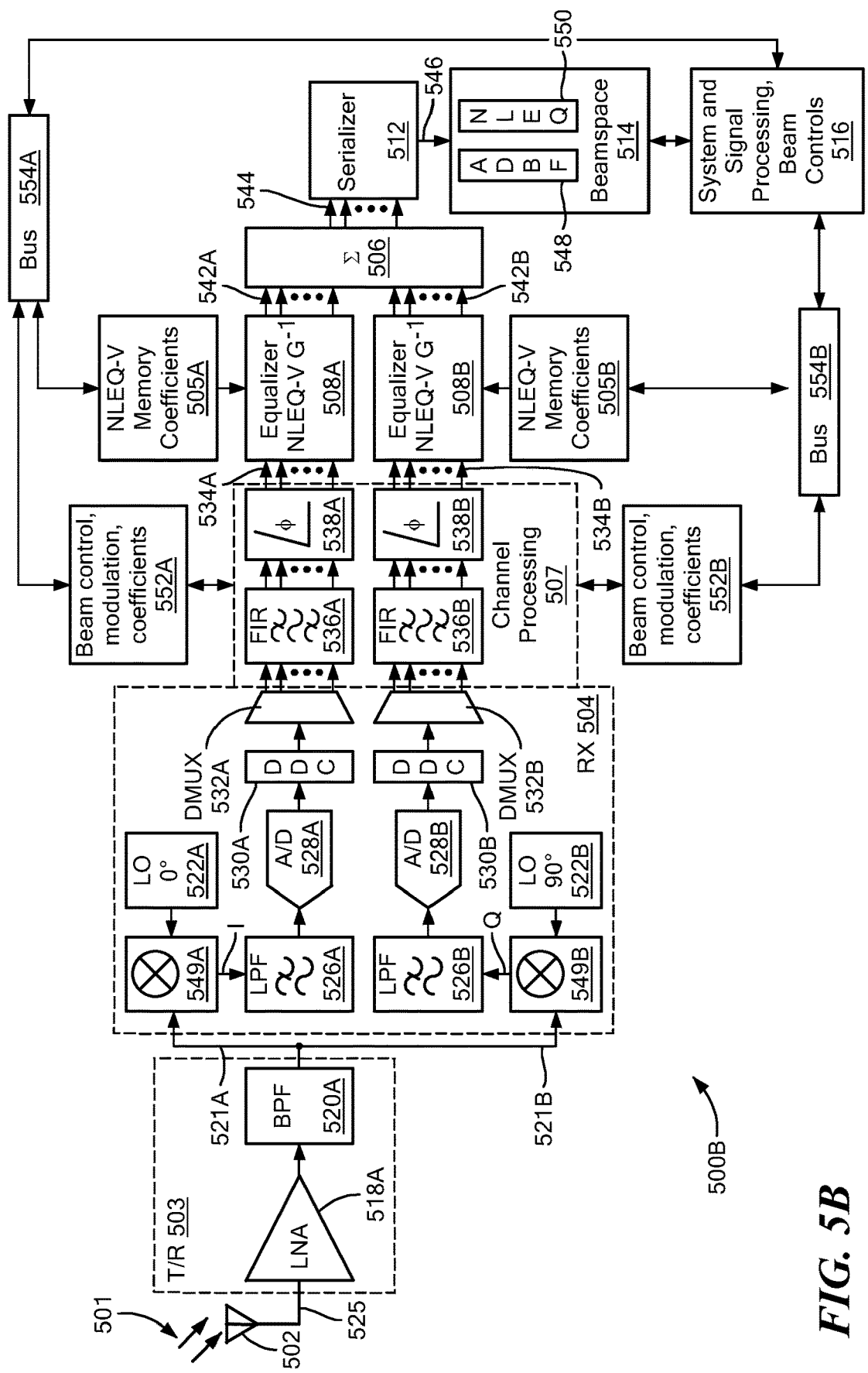
FIG. 5B is a second exemplary simplified system block diagram for application of an NLEQ filter in a system implementing the transfer function of FIGS. 3C and 4C, in accordance with one embodiment.

FIGS. 3A-4C (discussed above) expressed, at a high level, the process of at least some embodiments herein. FIGS. 5A-7B now depict these processes at a more detailed level. FIG. 5A (and also alternate embodiment FIG. 5B, described further below) is a first exemplary simplified system block diagram 500A for an application of an NLEQ filter, in a system implementing the transfer function 400 of FIG. 3C or 360 of FIG. 4C, in accordance with one embodiment. FIG. 5B is a second exemplary simplified system block diagram 500B for application of an NLEQ filter in a system implementing the transfer function of FIG. 3C or 4C, in accordance with one embodiment. FIGS. 5A and 5B are substantially similar except that, it can be seen that, in FIG. 5A, the equalization takes place before linearization (i.e., the equalizer 508 comes before the channel processing 507, which includes linearization in the FIR filter 536), whereas in FIG. 5B, the linearization takes place before equalization. In certain embodiments, the equalizer 508 is made using a Volterra filter or one of its derivatives. Both embodiments are contemplated herein. In certain embodiments, those of skill in the art will appreciate that the order of the linear equalization, the phase shifter, and the NLEQ do not matter. However, in certain embodiments, it is advantageous if the equalization (e.g., via NLEQ equalizer 508) takes place first, then the linear equalization FIR filter 536, then the phase shifter 538, because in some instances the linear equalization filter can sometimes add memory to the system, requiring an NLEQ filter 508 of greater complexity. In certain embodiments (e.g., as described further herein in connection with FIG. 5C, when the NLEQ filter coefficients are being determined, generally, the linear equalization filter is bypassed.

Figure 6:
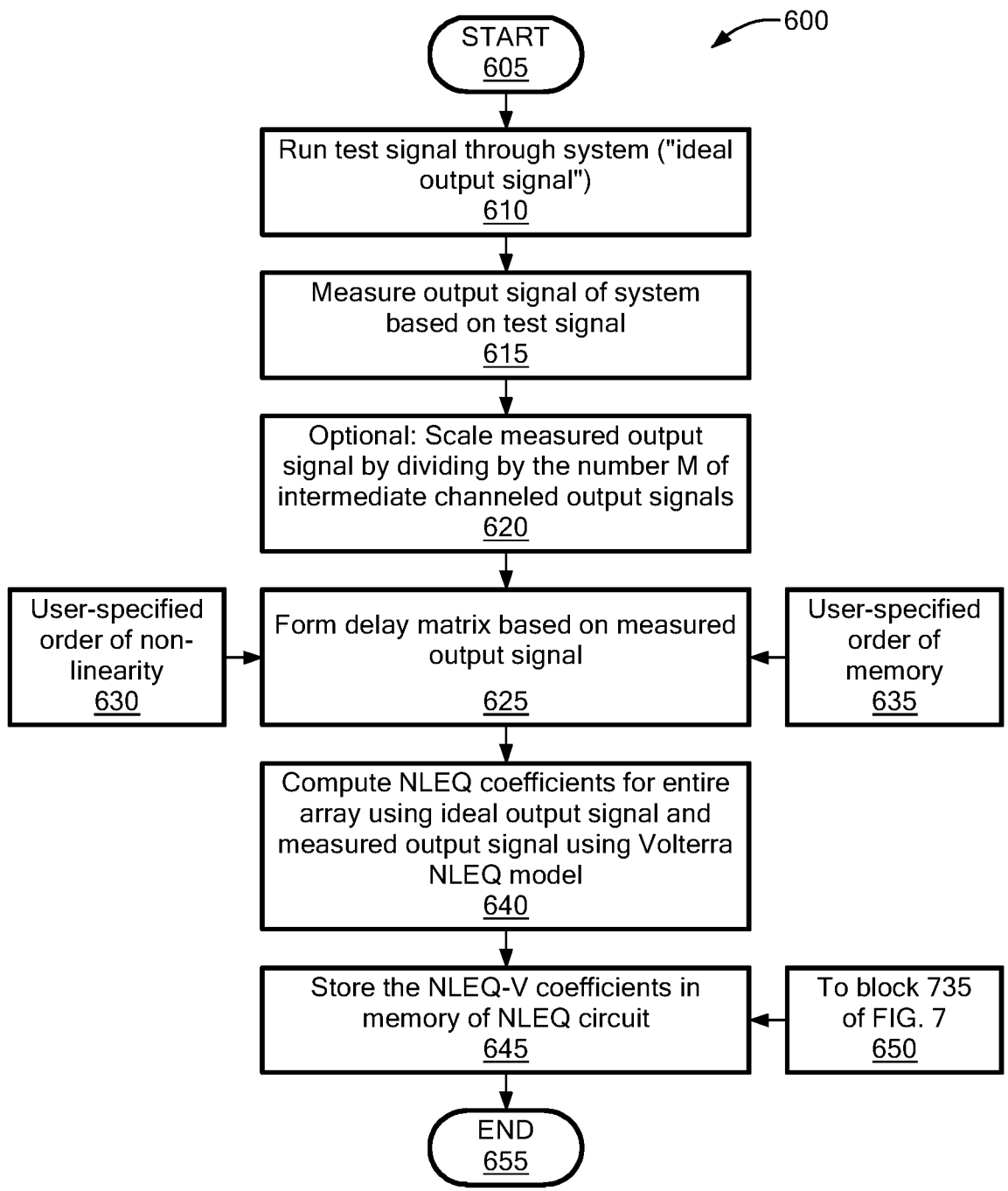
FIG. 6 is an exemplary process flowchart for NLEQ calibration and generation of NLEQ coefficients using Volterra NLEQ, in accordance with one embodiment.
Figure 7A:
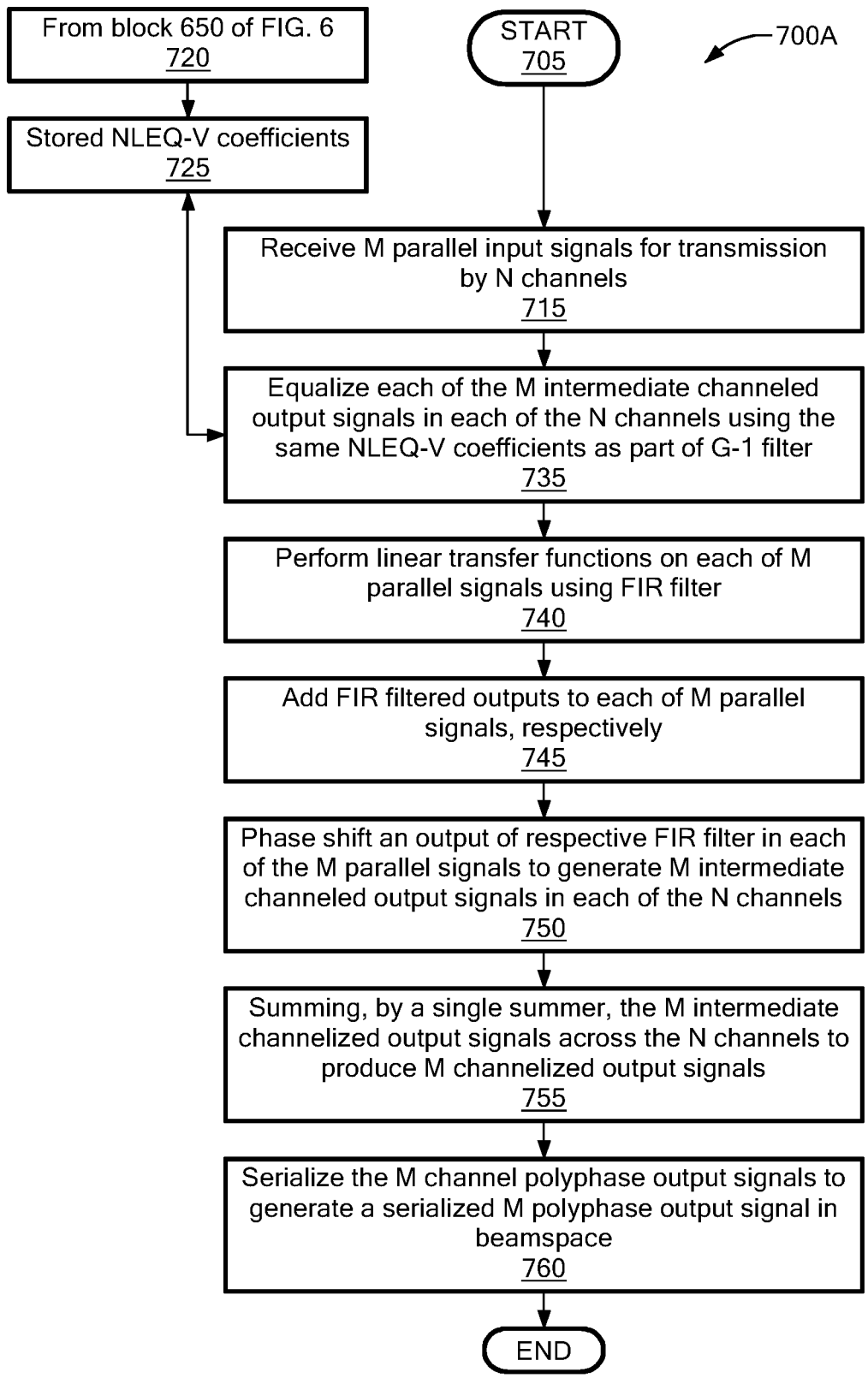
FIG. 7A is a first exemplary process flowchart for NLEQ where an identical beamspace NLEQ filter is used on each element in an array, at element level, for the system of FIG. 5A, in accordance with one embodiment.
Figure 7B:
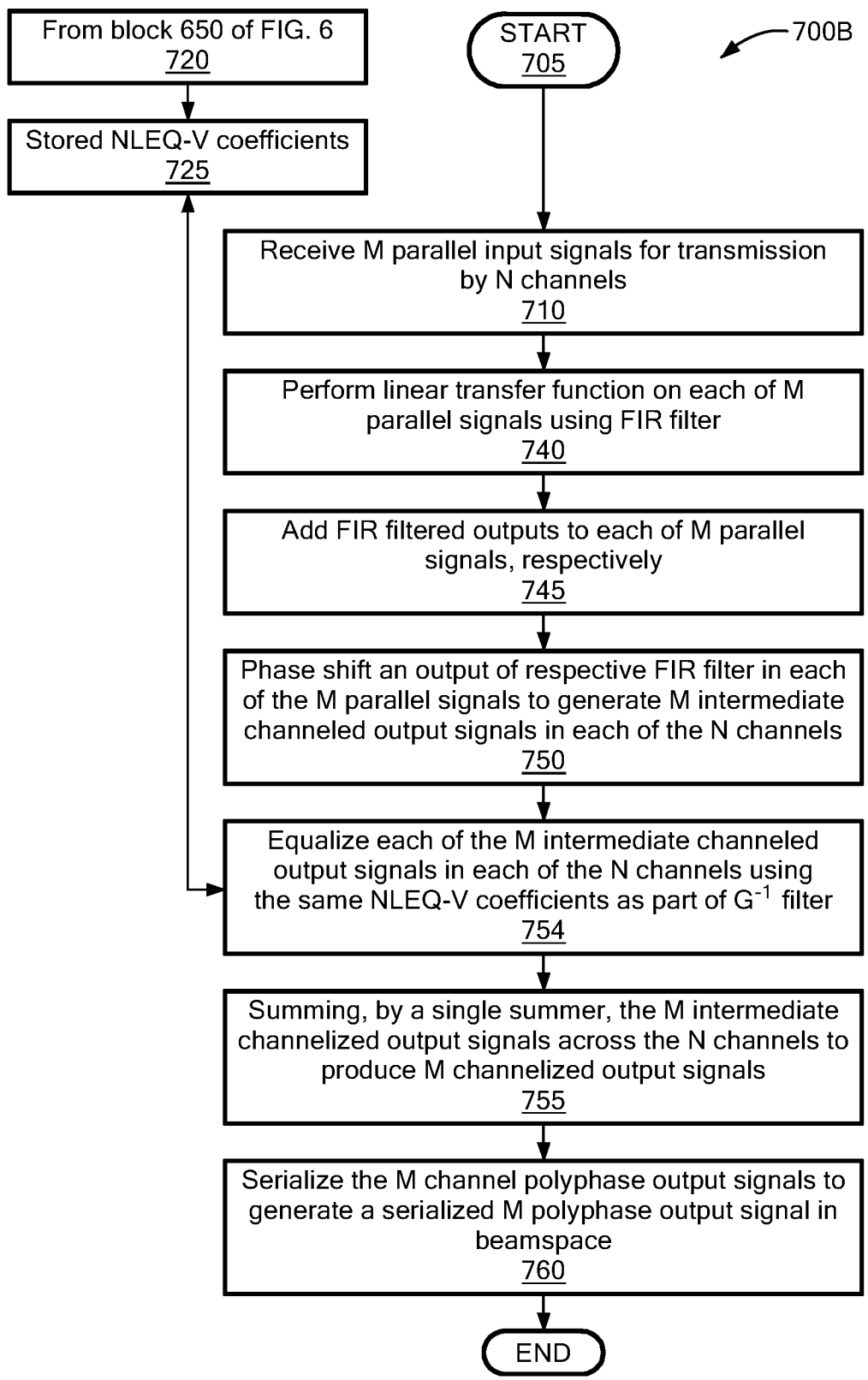
FIG. 7B is a second exemplary process flowchart for NLEQ where an identical beamspace NLEQ filter is used on each element in an array, at element level, for the system of FIG. 5B, in accordance with one embodiment.

FIGS. 7A and 7B are each an exemplary process flowchart 700A, 700B, respectively, for beamspace NLEQ, where an identical beamspace NLEQ filter (e.g., the $G^{-1}$ filter 308 of FIG. 3C) advantageously in at least some embodiments using Volterra NLEQ, is used on each element in an array, at element level, in accordance with one embodiment. FIG. 7A corresponds to the method used with FIG. 5A and FIG. 7B corresponds to the method used with FIG. 5B. The methods 700A of FIG. 7A, in certain embodiments, can be implemented using the system 500A of FIG. 5A. Similarly, the method 700B of FIG. 7B can be implemented using the system 500B of FIG. 5B. FIG. 5C, also discussed herein, is an exemplary simplified system block diagram 500C for generation of an NLEQ filter in a system also implementing the transfer function 300 of FIG. 3A, where the system 500C is configured for generating the NLEQ filter 308 of FIGS. 3A-4C for use in transfer function 400 using the transfer function 300 of FIG. 3A, in accordance with one embodiment. FIG. 6 is an exemplary process flowchart 600 for NLEQ calibration and generation of NLEQ coefficients, advantageously in at least some embodiments using Volterra NLEQ, in accordance with one embodiment. That is, the method 600 FIG. 6, in certain embodiments, can be implemented using the system of FIG. 5C.

Figure 5C:
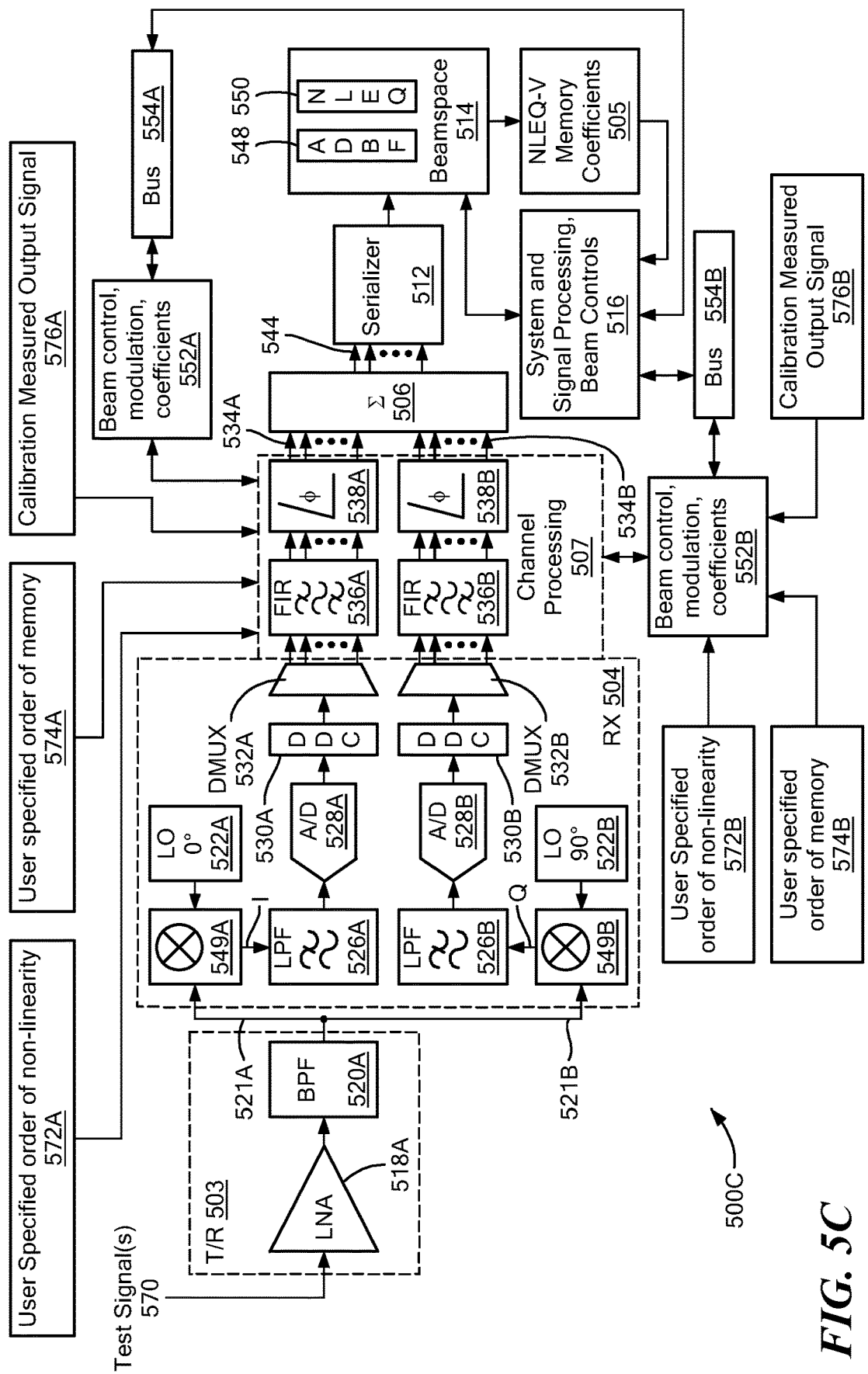
FIG. 5C is an exemplary simplified system block diagram for application of an NLEQ filter in a system implementing the transfer function of FIG. 3A, in accordance with one embodiment.

As will be apparent from the description below, FIGS. 5A, 5B and 5C are very similar in terms of system flow and components, and generally in these Figures the description of a component having a like reference number in all three Figures, is applicable to all three. However, FIG. 5C relates more to the generation of the NLEQ filter 308 of FIGS. 3A and 3B via calibration/training (i.e., the beamspace NLEQ filter generated for the entire array), whereas FIG. 5A and FIG. 5B relate more to applying the generated NLEQ filter 308 of FIGS. 3A/3B at an element level, as shown in FIGS. 3C, 3D, and 4C. Thus, the input signal to FIG. 5C is one or more test signals 570, whereas the input signal in FIGS. 5A and 5B is the actual received signal 525 from the antenna array 502. The calibration and coefficient generation of FIG. 5C, in certain respects, is based on at least some of the functionality from FIGS. 3-5 of the aforementioned '302 patent, along with the associated description.

In some embodiments, the systems associated with FIGS. 5A-5C may include hardware configured to accomplish a three-step process. In the first step, using the system of FIG.

5C and the method of FIG. 6, a beamspace Volterra NLEQ filter (including applicable coefficients) is generated for the entire array. In a second step, in connection with the system of FIG. 5A or 5B and the respective method of FIG. 7A (for FIG. 5A) or FIG. 7B (for FIG. 5B), the same beamspace Volterra NLEQ filter is used on/applied to each element in the array (i.e., an identical beamspace NLEQ filter is used on each element in the array), before beamforming, to accomplish a linear equalization that is performed in each channel to match phase and ideal gain behavior more closely between channels. Since linear equalization before beamforming can utilize a much simpler circuit than that required for a NLEQ circuit after beamforming, there is not a substantial burden on the processing resources or power consumption. In a third step, in connection with FIGS. 5A/7A or FIGS. 5B/7B, the linear equalization of each channel is then followed by a third step of summation of all the equalized channels.

For the descriptions herein in connection with FIGS. 5A-7B, it will be understood that, although a given system in actual use very likely would have N independent array channels, each being linearly equalized by a NLEQ filter of nth order, for purposes of simplicity in the explanations of FIGS. 5A-7B, the operations associated only one channel is described herein. One skilled in the art would recognize that the rest of the channels include similar hardware and function similarly. In addition, although embodiments are described going forward that relate to signal reception, those of skill in the art will appreciate that the systems described herein (e.g., FIG. 5A/5B) also are, of course, usable for transmission applications. For example, in transmission applications, a component such as analog-to-digital converter (ADC) instead would be a digital-to-analog converter (DAC).

Referring now to the system 500A of FIG. 5A and the corresponding method 700A of FIG. 7A, at the start, radiated signals 501 are received at antenna 502, which in certain embodiments is an element array. The antenna/element array 502 may include a single antenna, or a plurality of individual antenna elements. The antenna/element array transmits the radiated signals as an output 525 to one or more of a plurality of transceiver/receiver (also referred to as transmit/receive) modules 503, which are interposed between the antenna array 502 and the receiver 504 and the rest of the system. At this point, this corresponds to block 715 of the flowchart 700A of FIG. 7A, where M parallel input signals are received for transmission by N channels. For simplicity and clarity of the system block diagram in FIG. 5A, only one T/R module 503 is shown in FIG. 5A (the same is true for FIG. 5B), for the single channel being depicted, but the method of FIG. 7A (and, similarly, the method of FIG. 7B) does refer to actions being taken on all channels, as will be understood. The T/R modules 503 can include various elements such as low noise amplifiers 518, band pass filters 520, circulators (not shown), and power amplifiers (not shown), as understood by those of skill in the art. In addition, the receiver 504 is shown by way of illustration as a direct conversion type of receiver, but this is not, of course limiting.

In FIG. 5A (as well as in FIG. 5B), the output of the band pass filter 520 of T/R module 503 is RF signal 521 that is provided to the receiver 503 as a first mixer input 521A to mixer 549A and a second mixer input 521B to second mixer 549B. Each mixer input RF signal 521A, 521B is mixed with two LO signals that are identical in frequency, but 90°. out of phase, coming from first LO 522A and second LO 522B. This mixing arrangement, in certain embodiments, is implemented as a quadrature demodulator and creates the I/Q channels directly, in the form of a baseband analog RF signal corresponding to either an I or Q stream. Note that, in the simplified block diagrams of FIG. 5A and FIG. 5B, after the I and Q signals are output out of the mixers 549A, 549B, respectively, all of the "I" channel components have the suffix "A" and all of the Q channel components have the suffix "B" but are otherwise identical (this is likewise true in FIG. 5C). Each of the I and Q streams are run through respective low pass filters 526A, 526B and then are sampled by two ADC 528A and 528B, respectively.

After being converted to a digital signal by ADCs 528A, 528B, the I and Q signals are each digitally downconverted (DDC) to intermediate frequency (IF) at respective DDC modules 530A, 530B. The downconverted I and Q signals are then each decimated or channelized into plurality of parallel signals (e.g., N parallel signals). In certain embodiments, this is accomplished via respective demultiplexers (DMUX) 532A, 532B. In certain embodiments, this function also could be accomplished using a channelizer, or other comparably functioning circuits, as will be understood.

Each of the decimated signals out of the DMUX 532A, 532B (a plurality of parallel signals) is then provided to the next subsystem for either equalization (FIG. 5A) or linearization (FIG. 5B). This is the point where the embodiment of FIG. 5A differs from that of FIG. 5B, and wherein the method of FIG. 7A differs from the method of FIG. 7B. Notwithstanding the order of the operations, however, the functional operations for the series of equalization/linearization/phase shift functions of FIG. 5A and the series linearization/phase shift/equalization functions of FIG. 5B, are substantially similar and like numbers and like blocks in the flow charts, indicate like functionality. In addition, hereinafter, for simplicity, on each of the I and Q paths, only one of the plurality of decimated signals is provided, for clarity of description.

For simplicity, reference is first made to the embodiment corresponding to FIG. 5C and the flowchart of FIG. 6. Referring to the flowchart 600 of FIG. 6, the measured output signal of the array can optionally be divided by the number M of intermediate channeled output signals (block 620). This optional scaling can help with the overall conservation of energy of the system, as will be understood.

Reference is now made to the embodiment corresponding to FIG. 5A and the flowchart of FIG. 7A. Referring to FIGS. 5A and 7A, the equalizers 508A, 508B are configured to equalize each of the M intermediate channeled output signals in each of the N channels, using the beamspace NLEQ filter $G^{-1}$ that is generated for the entire array (in accordance with the system of FIG. 5C and the method of FIG. 6, described further herein) (blocks 720, 725, 735). The equalizers 508A, 508B are, in certain embodiments, non-linear equalizers (NLEQ) that are configured using a previously generated Volterra NLEQ filter generated for the entire array (in FIGS. 5C/6), where the Volterra NLEQ filter is configured in accordance with a third order Volterra model (e.g., as shown in equation (2) herein). The equalizers 508 are also described further below.

After equalization (block 735), the set of equalized signals are provided to channel processing 507, which includes linear filtering via FIR filter 536, by performing a linear transfer function on each of the M parallel output signals using the FIR filter 536 (block 740). The channel processing subsystem 507 includes, for the I path and the Q path, a respective finite impulse response (e.g., FIR filter 536A, 536B and a phase shifter 538A, 538B, respectively). In certain embodiments, as is understood, the FIR filter 536A, 536B is configured to perform linearization, whether after equalization (as done in FIG. 5A/7A) or before equalization (as done in FIG. 5B/7B). In certain embodiments, the FIR filter 536 can configured to do some linear equalization (e.g., to flatten the passband), but then in those embodiments NLEQ filter 508 would be configured to perform the linearization (e.g., swapped functionality, in certain embodiments). Thus, each respective decimated signal, whether directly (FIG. 5B) or after equalization (FIG. 5A) is then input to the respective FIR filter 536A, 536B, of nth order, having n delay taps (a delay matrix; not shown in FIGS. 5A/5B but described further below in connection with FIGS. 5C and 6) to perform a linear transfer function in time domain. For simplicity, the n delay taps are not depicted in FIGS. 5A/5B, but they will be well understood in the art (e.g., as depicted as element 312 in FIG. 3 of the '302 patent, which is incorporated by reference). The filter coefficients for each delay tap are stored in a memory 522A, 522B electrically coupled to a processor (in the system and signal processing subsystem 516), via a bus 554A, 554B. (In certain embodiments, these filter coefficients are generated in accordance with the system and method of FIGS. 5C/6, as discussed further herein). Although the FIR filters 536A, 536B and the equalizers 508A, 508B are depicted as separate functional blocks in FIGS. 5A and 5C, one of skill in the art will appreciate that, in certain embodiments, the same circuitry can be used to accomplish both functions. One of skill in the art will appreciate that, in some embodiments, the linear portion of the NLEQ filter 508 also can be used to accomplish linearization, but this is not always optimal, because this could result in the linear filter being more frequently updated.

Referring again to FIGS. 5A and 7A, in the channel processing block 507, a linear transfer function is performed on each of the M parallel signals in each of the I and Q paths, using the FIR filters 536A, 536B (block 740). As is understood in the art, the outputs of each delay tap of FIR filters 536A, 536B are multiplied by the specified filter coefficients output from memory 552A, 552B (which, in certain embodiments, are computed in accordance with FIGS. 5C and 6 and an NLEQ Volterra process, described further herein). In certain embodiments, the memories 552 for the N channels may be implemented in a single memory (e.g., a RAM that is coupled to each of the N channels). The resulting signals are then added to each of the M parallel signals, respectively (block 745), before being run through respective complex phase shifters 538A, 538B (block 750), to yield respective filtered and phase shifted intermediate channelized outputs 534A, 534B of the active input channel.

In certain embodiments, the complex phase shifters 538A, 538B are configured to execute array beamsteering, where the phase shift is accomplished through a multiplication of the filter output sum from the FIR 536 with a coefficient specified by a beam control signal from the beam control/ coefficients subsystem block 552 (which can, for example, include a bandwidth modulator (not shown in FIGS. 5A/5B), which in turn can have its set of coefficients specified by the beam control, which receives its control signals from the system and signal processing/beam controls subsystem 516, via the bus 554. In some embodiments, the beam bandwidth modulator's coefficients are determined by conventional array beamsteering techniques, executed by the beam control 516, considering the commanded steering direction and the antenna elements required basic properties, such as frequency and location, as will be understood by those of skill in the art. Note that the phase shifters 538 are doing the beam steering of the fundamental (desired signals). The NLEQ equalizers themselves cause the phase shifts on the third-order intermods, as shown by the phase decorrelation shown in 1014 in FIG. 10 (discussed further herein).

Referring again to FIGS. 5A and 7A, after phase shifting (block 750), the M intermediate channelized outputs signals are summed by a single summer (block 755) across the N channels, to produce M channelized output signals. In certain embodiments, as shown in FIG. 3D, the digital beamformer 326 (FIG. 3D) serves as the summer.

For the embodiment of FIG. 5B/7B, many of the identically named components and blocks perform the same operations and functions as the similarly named components and blocks in FIGS. 5A and 7A, but the order of operations changes. Referring briefly to FIGS. 5B and 7B, after the M parallel input signals for transmission by N channels are received (block 710), they are provided to the receiver 503, mixer 549, low pass filter 536, ADC 528, DDC 530, and DMUX 532, as described above (these steps are not shown in either FIG. 7A or 7B), then, the decimated signals of the DMUX 532 are provided to the channel processing block 507, for linearization in the FIR filter 536. For example, referring to FIG. 7B, a linear transfer function is performed on each of the M parallel signals using the FIR filter 536 (block 740). The FIR filtered outputs are added to each of M parallel signals, respectively (block 745), then the output of the FIR filter 536 is phase shifted (in phase shifter 538) to generate M intermediate channeled output signals in each of the N channels (block 750).

The filtered and phase-shifted intermediate channeled outputs 534A, 534B are then provided to the equalizer 508. These NLEQ-V coefficients can be stored (block 725) and accessed via bus 554, in some embodiments. In block 754, the NLEQ filter 508 equalizes each of the M intermediate channeled output signals, using the same NLEQ-V coefficient (as part of the $G^{-1}$ filter), for each output signal. Then, the equalized output signals are summed by a single summer (block 755), similar to block 755 of FIG. 7A, and then the M channel polyphase output signals are serialized to generate a serialized M polyphase output signal in beamspace (block 760)

As noted previously, the equalizers 508A, 508B are, in certain embodiments, non-linear equalizers (NLEQ) that are configured using a previously generated Volterra NLEQ filter generated for the entire array (in FIGS. 5C/6), where the Volterra NLEQ filter is configured in accordance with a third order Volterra model (e.g., as shown in equation (2) herein). For example, in certain embodiments, once the NLEQ calibration/training is performed (in accordance with FIGS. 5C/6, as described herein) and a delay matrix is formed (block 625 of FIG. 6, discussed further herein), in accordance with the Volterra expansion, Volterra NLEQ coefficients for the entire array are determined, stored in memory, and provided to the method 700A/700B (blocks 735, 740) and applied (block 745) as one overall Volterra NLEQ coefficient set ("NLEQ-V coefficients") for the entire array (blocks 640-650 of FIG. 6; blocks 735-740 of FIGS. 7A/7B)), which helps to form the beamspace Volterra NLEQ filter 308 of FIG. 3A-4. This NLEQ-V coefficient set is stored in memories 505A, 505B and applied to each decimated channel on the I path and Q path (block 745) to create a set of equalized intermediate channelized output signals 542A, 542B. That is, the same NLEQ-V coefficient set, which is computed for the entire array, as a single coefficient calculation process (see FIGS. 5C/6 below) is applied to each decimated channel, which means the NLEQ-V coefficients for the array is applied at element level. This is in contrast to prior art approaches where, by contrast, each channel has to have its own corresponding, independently computed NLEQ-V coefficient set, or wherein the NLEQ is performed on the entire array after beamforming. In certain embodiments, it has been found that distributed beamspace NLEQ decorrelation as described herein (i.e., applying the same NLEQ coefficient at element level) can improve receiver linearity by approximately 30 dB for 1000 channel arrays. In certain embodiments, it has been found that distributed beamspace NLEQ decorrelation can provide more decorrelation the more elements in the array.

The NLEQ equalizer 508 of FIG. 5A and FIG. 5B, NLEQ process, computation of NLEQ coefficients, etc. can be implemented in many known ways, as is understood. In certain embodiments, the equalizer 508 is implemented as shown in the aforementioned and incorporated by reference '302 patent, but this disclosure is not limited to that methodology. The NLEQ filter 308 can be causal or non-causal, adaptive or non-adaptive, standalone or utilizing system-level or channel-level feedback in order to store, generate, or update an arbitrary fixed or changing number of filter coefficients. In certain embodiments, the inverse filter characterizes an inverse of undesired non-linear behavior of one or more elements in the system of FIGS. 5A/5B, including one or more of the LNA 518, bandpass filter 520, mixer 549, low pass filter 526, analog-to-digital converter 528, digital down converter 530, demultiplexer 532, FIR filter 536, phase shifter 538, summer 506, and serializer 512. Certain embodiments herein use a causal, fixed length, non-adaptive, standalone NLEQ process, implemented here using the Memory Polynomial model, using the hardware described in FIGS. 5A/5B and associated firmware and/or software executed by a processor. However, those skilled in the art would recognize that other known NLEQ processes may equally be utilized and therefore are within the scope of at least some embodiments.

In certain embodiments, before calculating the delay matrix to solve for the NLEQ-V coefficients, the measured system output can optionally be divided by the number M of intermediate channeled output signals (block 620 of FIG. 6). This optional scaling can help with the overall conservation of energy of the system, as will be understood).

Referring again to FIGS. 5A and 7A, after equalization in the equalizers 508A, 508B (block 745), the resultant equalized intermediate channelized output signals 542A, 542B (M total equalized intermediate channelized output signals) are then summed together, using a single summer 506 (block 750) to produce M channelized output signals 544 at the decimated/channelized sampling rate. For example, recall that demultiplexers 532A, 532B had splits the incoming channel into N sub-channels, each at 1/N of the sampling rate of the respective ADCs 528A, 528B. The N polyphased output signals 544 are then serialized by a serializer 512 to form a serialized signal beam 546 in beamspace (block 755). In some embodiments, serializer 512 is also a de-serializer capable of de-serializing signals.

Effectively, because the FIR filters 536A, 536B contain only linear terms, the transfer function executed in the FIR filters 536A, 536B is linear. In addition, in the embodiment of FIG. 5A, which includes putting the NLEQ filters 508 before the FIR filter 536, the NLEQ filter is going to under- or over-correct the intermodulation while having minimal effect on the fundamental. Thus, the NLEQ filter, in certain embodiments, puts a phase shift on the intermodulation distortion without putting a phase shift on the (desired) fundamental frequency signals. In contrast, as is understood, the FIR filters 536 and the phase shifter 538 are only doing linear operations, which operations do not distinguish between the fundamental and the intermodulation distortion.

Accordingly, the FIR filters 536 and the phase shifters 538 affect the fundamental frequency and the intermodulation distortion in exactly the same way. Thus, the embodiment of FIG. 5A can be more advantageous than that of FIG. 5B because in FIG. 5A, the NLEQ filtering is done first. However, the embodiment of FIG. 5B (doing linearization before NLEQ) still provides advantageous improvements in intermodulation suppression and decorrelation as compared with known approaches, as will be appreciated.

Thus, in the embodiment of FIG. 5A, the linear FIR filter 536 is configured to apply a desired type of passband correction (for example, to flatten it) that will affect the intermod and the fundamental in the same way. As noted herein the NLEQ filter 508 puts a phase shift on the intermodulation distortion without putting one on the fundamental. That is, in certain embodiments, the NLEQ filter 508 will under or over correct the intermodulation with minimal effect on the fundamental. Thus, for either FIG. 5A or FIG. 5B, it can be seen that, so that the phase, when eventually run through the NLEQ equalizer 508A, 508B, results in the intermodulation distortion products residue having a phase that is shifted by 180° for approximately half the elements in the array. As will be understood, the aforementioned 180° phase shifting of the intermodulation distortion enables dynamic range gain from array scaling/ decorrelation (i.e., from applying this to all elements of the array).

Normally, one of the major benefits of digital phased arrays is the array scaling effect that averages uncorrelated errors to improve dynamic range. Because odd-order intermodulation distortion (e.g., $3^{rd}$ order intermodulation distortion as described herein) is naturally correlated to the desired signal in a digital array, there normally is no array scaling benefit. However, the approach provided and described herein results in each individual channel's intermodulation distortion being partially decorrelated, which establishes a partial array scaling effect for this intermodulation distortion. Thus, the more elements in the array, the greater the potential decorrelation (when all the partial decorrelation is considered). This will be seen further herein in the example simulated data.

For generating the NLEQ-V coefficient as part of training/ calibration of the system in which it is used, reference is now made to FIGS. 5C and 6, where FIG. 5C is an exemplary simplified system block diagram 500C for generation of an NLEQ filter in a system implementing the transfer function of FIG. 4 that is generating the NLEQ filter using the transfer function of FIG. 3A, in accordance with one embodiment, and wherein FIG. 6 is an exemplary process flowchart 600 for NLEQ calibration/training and generation of NLEQ coefficients using Volterra NLEQ, in accordance with one embodiment. As noted previously, FIG. 5C is in many respects substantially similar to FIGS. 5A and 5B. In certain embodiments, FIGS. 5A, 5B and 5C are implemented using the same system, where, for example, a switch at the input to T/R 503 can switch between the test signals input 570 (FIG. 5C) and the received signal input 525 (FIGS. 5A/5B). In addition, as will be appreciated, during a calibration/ training mode, if the same system is used for both FIGS. 5A and 5C, other switches along the I and Q paths can be used to switch in and out certain functions and/or to bypass certain functions. For example, to effectively modify the architecture of FIGS. 5A/5B to that of FIG. 5C, a switch, coefficient usage, or other mechanism (not shown in FIG. 5A, 5B, or 5C, but will understood) could be used to bypass equalizers 508A, 508B. And, of course, the control signals and coefficients provided via the bus 554A, 554B can be varied easily. However, for simplicity in explaining the generation and application of the NLEQ-V coefficient, the two separate system block diagrams are used herein.

Referring now to FIGS. 5C and 6 in regard to NLEQ calibration, FIG. 5C receives one or more test signals 570 (block 610). In certain embodiments, two calibration signals are needed to calculate the NLEQ coefficients (in block 640): A known signal, referred to as the calibration ideal output signal, and a calibration measured output signal. The calibration measured output signal is the resulting output signal of the system (output of serializer, block 512) when the test signal input (570) is the calibration ideal output signal. This calibration waveform set contains the necessary system behavior to calculate the NLEQ coefficients as detailed in FIG. 6. As is known, phased arrays and RF transceivers can be calibrated by running a test signal through the system, such as a chirp, and then the phase offset or distortion on the signal from the ideal signal (as if no phase offset or distortion occurred) is measured. Phase shifts, amplitude shifts, multiplications, and time delays are applied to calibrate the measured signal to be as close to the ideal signal as possible. The aforementioned calibration measured signal is the measured output signal that has been calibrated, while the calibration ideal output signal is the so-called "ideal" sign. The calibration measured output signal and the calibration ideal output signal can each have a variety of characteristics, depending on what in a given system needs to be calibrated.

For example, in an RF receiver that is receiving a signal through a limiter, LNA, balun, mixer, and/or filter, a baseband signal may have different non-linearities than an RF receiver chain that is direct digital with only a limiter, LNA and analog to digital converter (ADC) in the chain. Referring to FIGS. 5C and 6, the ideal output signal is applied as a test signal at input 570, and a system output is measured at the single output of serializer 512 (block 615). The measured output signal is scaled by dividing the number M of intermediate channeled output signals (block 620). This optional scaling can help with overall conservation of energy of the system, as will be understood. Thus, the calibration measured output signal can optionally be divided by the number M of intermediate channeled output signals (620) in order to remove the scaling effect of the digital summation (506). In block 625, a delay matrix is formed based on the measured output signal, on a user specified order of non-linearity 572 (block 630) and on a user specified order of memory 574 (block 635), in a manner similar to that described for the delay matrix in the aforementioned '302 patent.

For example, in one embodiment, in one embodiment, blocks 630 and 635 specify the NLEQ model's order of non-linearity and order of memory, respectively, which directly effects the dimensions of the delay matrix and number of taps and order of filter (e.g., $3^{rd}$ order filter) that is required to linearize the signal, namely, to create a linear phase slope and flat amplitude response over frequency. As will be appreciated, in at least some embodiments, it is advantageous for an NLEQ filter meant to cancel $3^{rd}$ order intermodulation distortion, to include $5^{th}$ and/or $7^{th}$ order Volterra kernels, as well. The flat amplitude, in certain embodiments, can have a tolerance, e.g., defined to be within 1 dB flatness, but can vary depending on system requirements, so this tolerance is not limiting. In some embodiments, as few as 8 delay taps per RF channel provide a reasonable amplitude, phase, and overall filter response. The number of taps required is predominantly dictated by a combination of the system's sample rate, frequency-dependent non-linear behavior's characteristics, desired operational bandwidth, and performance tolerances across the operational bandwidth.

Various approximations, such as least mean squares (LMS) or recursive means squares (RMS) are usable to approximate the NLEQ model coefficients. For example, in certain embodiments, a Moore-Penrose pseudoinverse process executed in blocks 625-640 on the delay matrix and the digitized calibration ideal output signal 570 to determine the least squares approximation of the NLEQ-V (Volterra filter) model coefficients. These NLEQ-V model coefficients are the coefficients used in the equalizer 508 of FIGS. 5A/5B and are loaded into the coefficient memory 505 (block 645), from the system and signal processing block 516, via the bus 554.

Thus, after the delay matrix is formed (block 625), the NLEQ coefficients are determined for the entire array (block 640), using known methods (e.g., the methods shown and described above and/or in the aforementioned '302 patent). In one embodiment, the NLEQ coefficients for the entire array are computed using the ideal output signal and the measured output signal using Volterra NLEQ mode. In certain embodiments, as described previously, the NLEQ coefficients that are determined are Volterra NLEQ coefficients as associated with Volterra NLEQ filters (termed "NLEQ-V coefficients" herein) and are determined via the methods described in the aforementioned '302 patent or other known methods. In certain embodiments, this determination can take place in a processor, GPU, field programmable gate array (FPGA), application specific integrated circuit (ASIC) or other appropriate device that is part of the system and signal processing 516. In certain embodiments, in the equalizer 508, the delay matrix is multiplied with the NLEQ-V coefficients to form the equalized output signal 542 that is fed to the summer 506.

In certain embodiments, placement of the beamspace NLEQ post-inverse filter in the element/channel portion of an array architecture, according to the disclosed embodiments, takes advantage of the fact that doing this provides an added decorrelation not seen in the known art (as described previously), so the larger the array gets (i.e., the more elements you can apply the same $G^{-1}$ filter to), the better the benefit to the overall system dynamic range gain performance (can approach $10 \log_{10} N$ dB improvement) vs other NLEQ approaches. This is shown further herein in connection with FIG. 11, discussed further below.

Figure 8A:
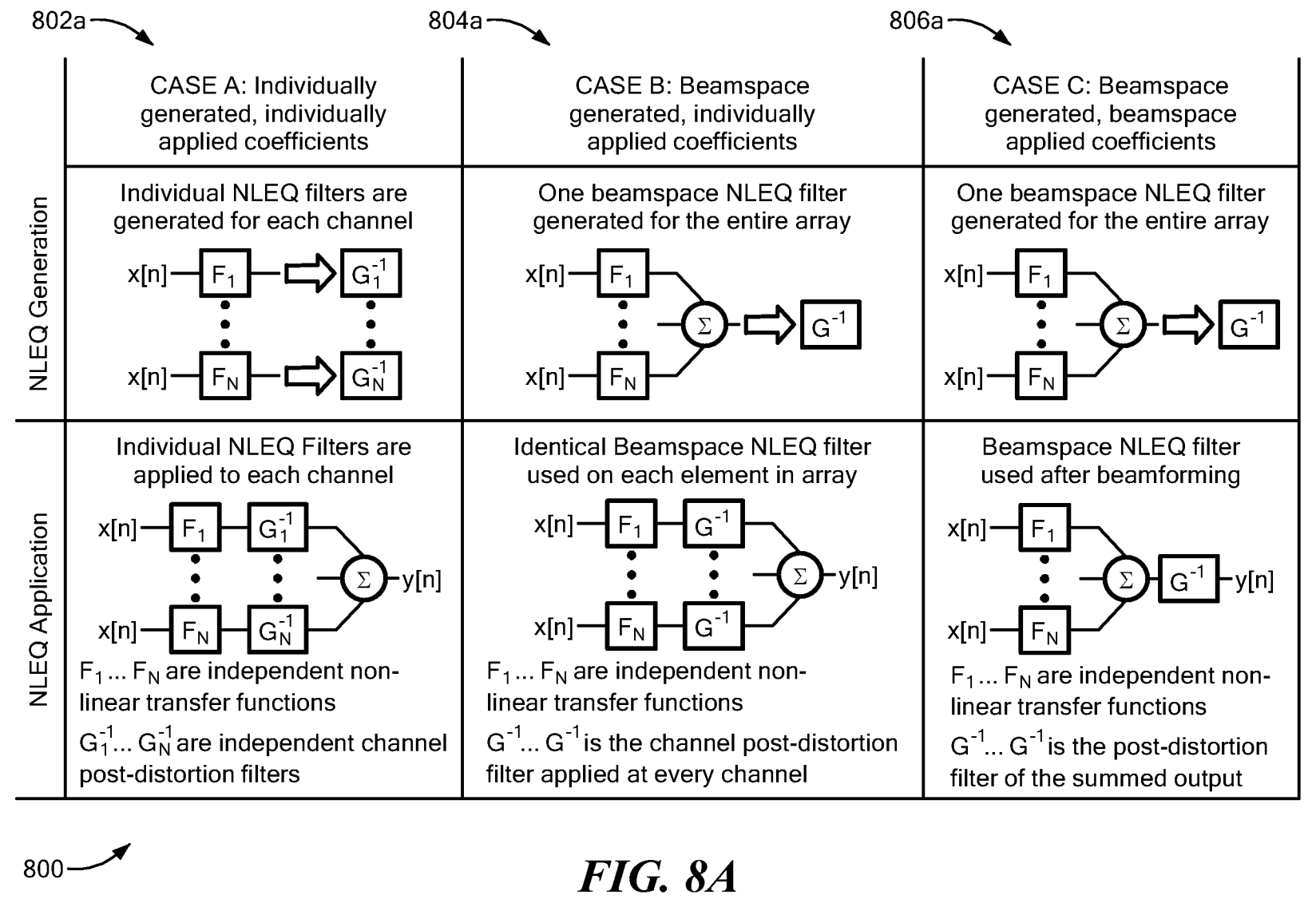
Figure 8B:
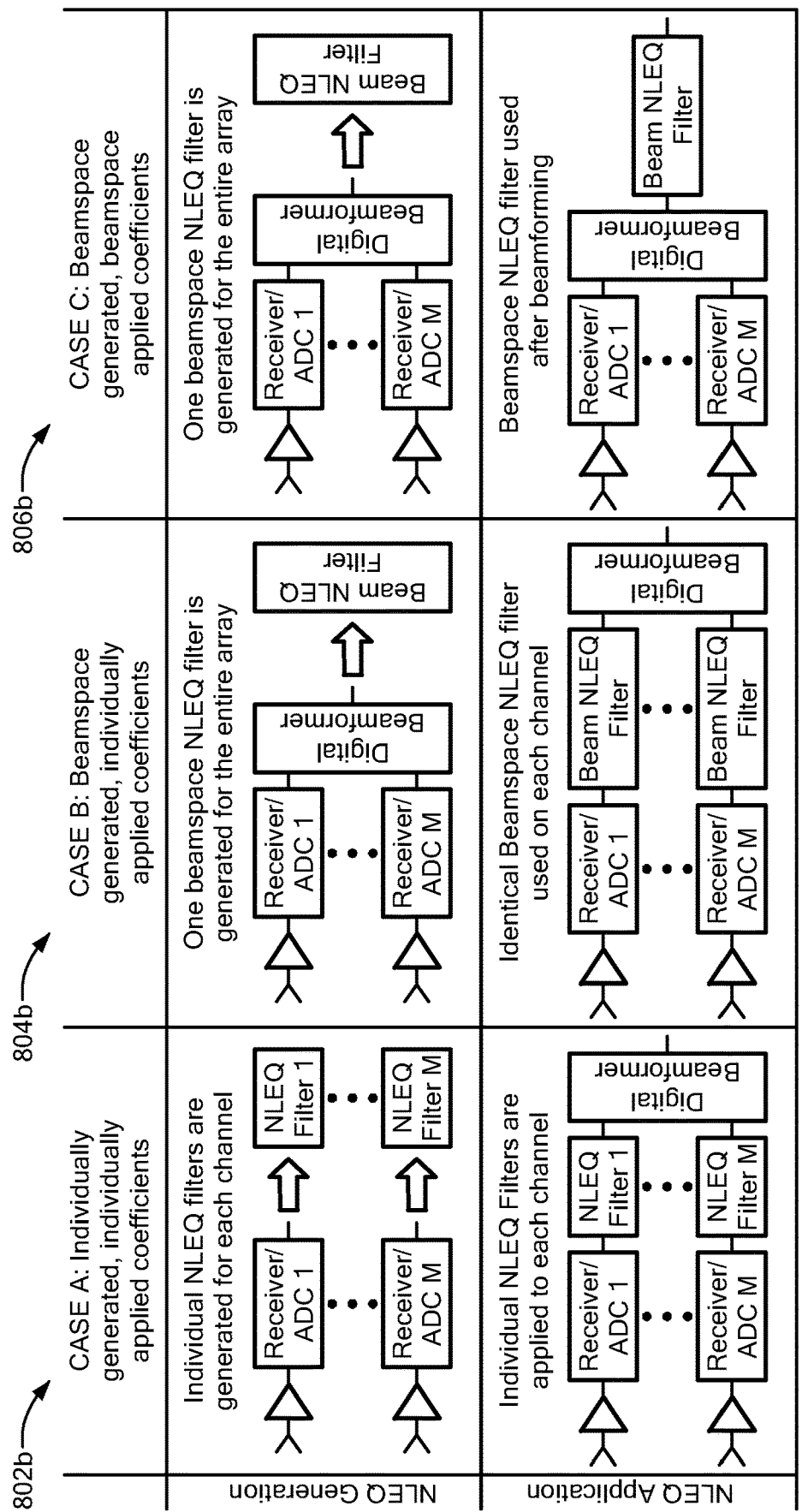
FIG. 8B is a second exemplary chart summarizing and comparing three approaches of applying NLEQ, in accordance with one embodiment.

FIG. 8A is a first exemplary chart (800) of a simplified example architecture block diagram to demonstrate three approaches of applying non-linear equalization (NLEQ), in accordance with one embodiment, including Case A 802a, Case B 804a, and Case C 806a. FIG. 8B is a second exemplary chart 850 summarizing and comparing three approaches of applying NLEQ, in accordance with one embodiment, including Case A 802b, Case B 804b, and Case C 806b. These Cases (A, B, and C) also will correspond to the same cases in the simulation data of FIGS. 9-11 (that is, for simulation data labeled "Case A," the configuration being simulated corresponded to the configuration described for that Case in FIGS. 8A and 8B, etc.). FIG. 8A and FIG. 8B depict the same arrangements and case but in different ways: FIG. 8A shows the cases by mathematical functions and FIG. 8B shows the cases in terms of system level components, as will be appreciated.

Referring to FIGS. 8A and 8B, in case A, it can be seen that individually generated, individually applied coefficients are applied, where individual NLEQ filters are generated for each channel (which are not all the same NLEQ filter) and then the individual NLEQ filters are applied to each channel. This can tend to require a lot of computational work.

In case C 806a/806b, it can be seen that a single beamspace NLEQ filter is generated for the entire array (in a manner not that dissimilar from generation of the NLEQ filter described above in connection with FIGS. 5A-7B), but the beamspace NLEQ filter is used after beamforming, not at the element level.

In case B 804a/804b, it can be seen that there is one beamspace NLEQ filter generated for the entire array (similar to NLEQ generation for Case C 806a/806b), but the NLEQ filter is applied differently in Case B 804a/804b. In certain embodiments, Case B 804a/804b uses the NLEQ generation approach of Case C but applies it in a novel way (by applying the same beamspace NLEQ filter to each element in the array) to improve performance, as described herein.

Figure 9:
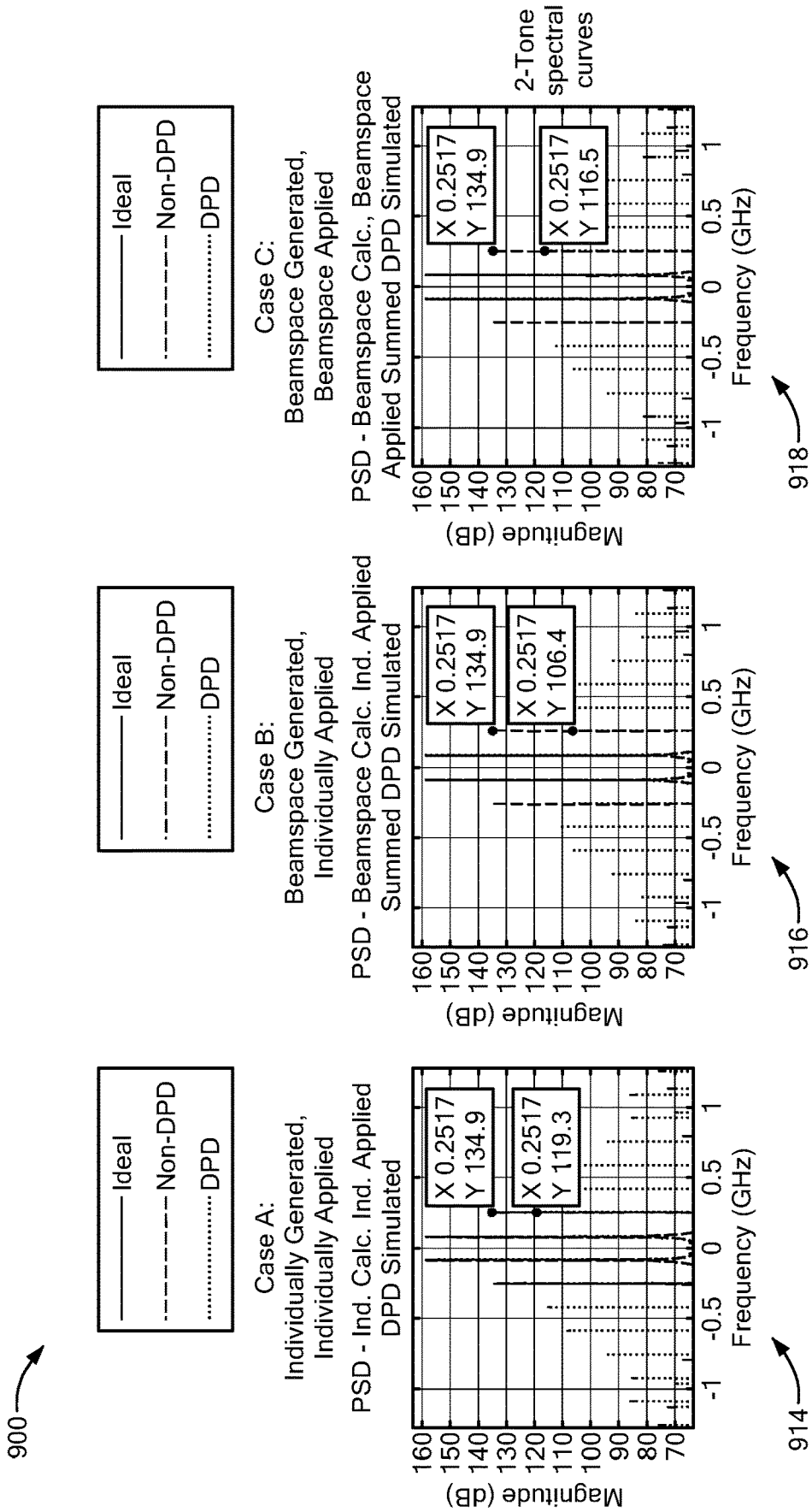
FIG. 9 is an exemplary first set of simulation results showing distortion rejection for the three approaches of FIGS. 8A and 8B, in accordance with one embodiment.

FIG. 9 is an exemplary first set 900 of simulation results showing distortion rejection for the three approaches of FIG. 8, in accordance with one embodiment.

The row of simulations 914 (Case A), 916 (Case B) and 918 (Case C) show signal magnitude when two tones are applied, showing spectral curves as a function of frequency, for each case. In each graph, the boxes with numbers show the coordinates corresponding to the start and end (in magnitude) of the non-DPD (non-digital pre-distortion) portion of the $3^{rd}$ order intermod, i.e., a system with no NLEQ filtering, and the lower box of numbers show the coordinates of the peak value of the $3^{rd}$ order intermod in a system with the given DPD (digital pre-distortion) applied in each case. As can be seen, in all three cases, the X and Y values of the $3^{rd}$ order intermod are the same in each case in the non-DPD situation (i.e., the situation with no NLEQ filtering), which is to be expected. As can be seen in the row of graphs of FIG. 9, each case results in the following peak $3^{rd}$ order intermodulation product magnitude (shown as the Y value in the lower box of each graph):

Case A: 119.3 dB
Case B: 106.4 dB
Case C: 116.5 dB

Thus, the lower magnitude of the intermod product in Case B shows that Case B has larger $3^{rd}$ order intermod rejection than Cases A and C (over 10 dB improvement in this example).

Figure 10:
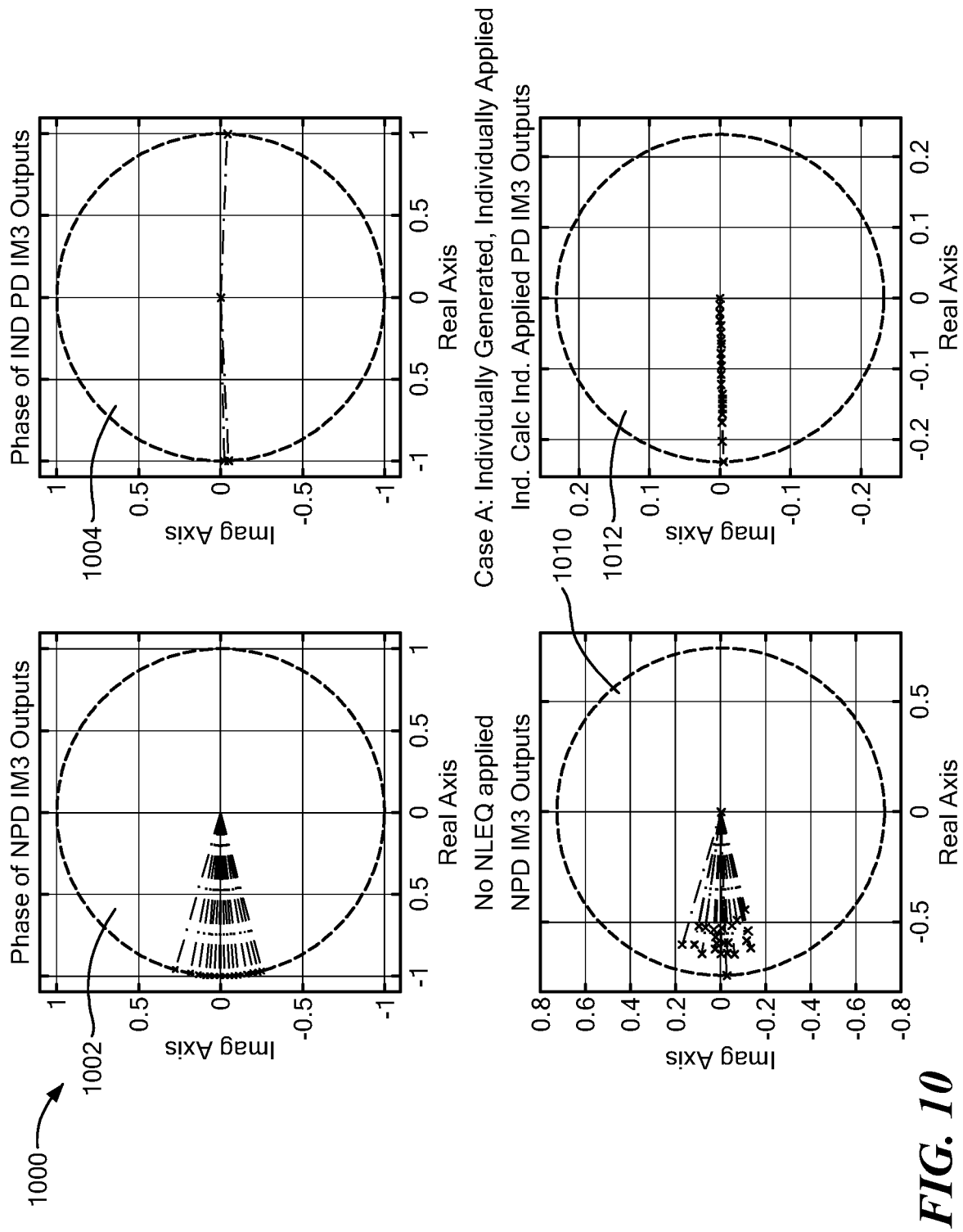
FIG. 10 is an exemplary second set of simulation results showing phase decorrelation for the three approaches of FIGS. 8A and 8B, in accordance with one embodiment.
Figure 10:
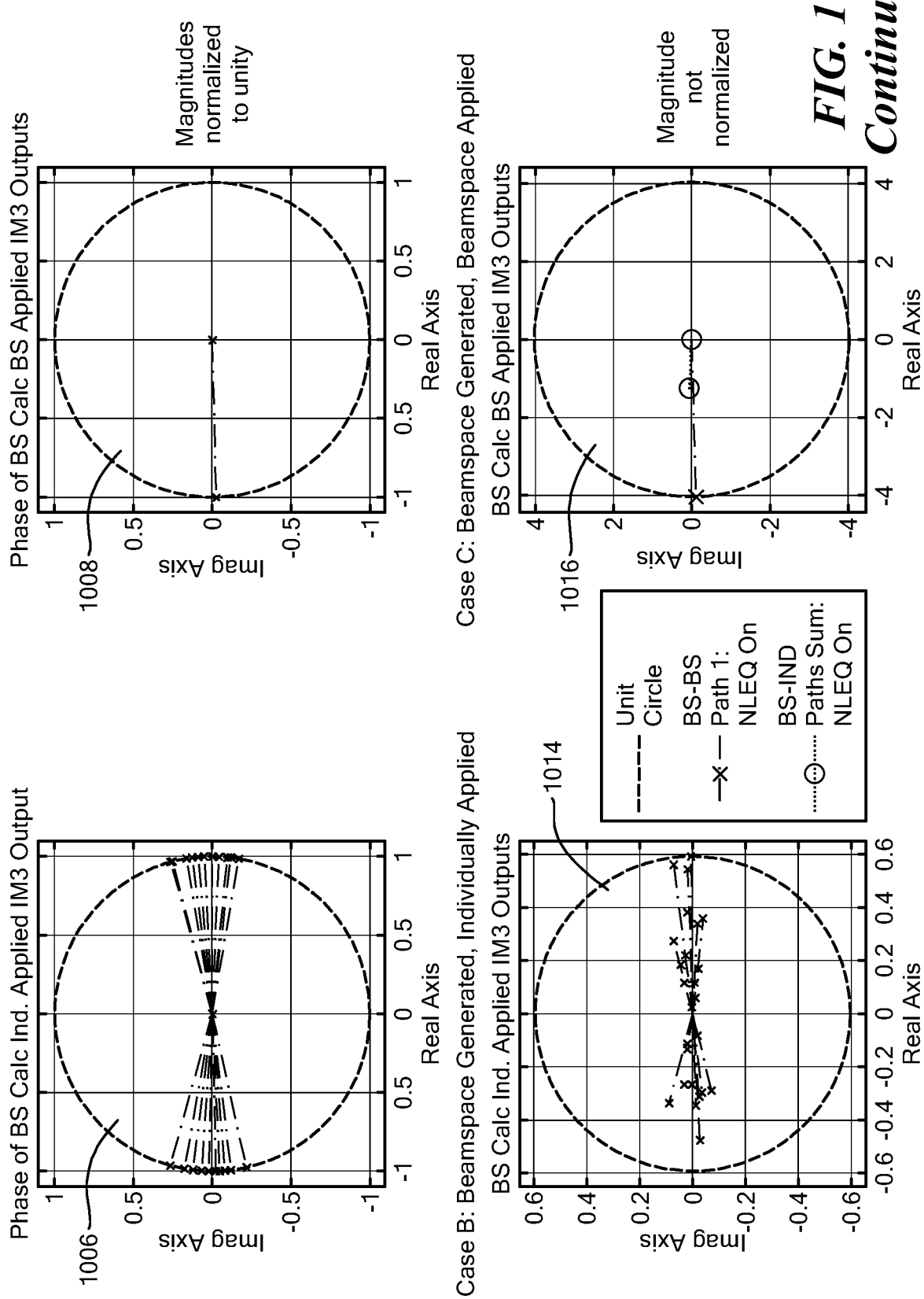

FIG. 10 is an exemplary second set of simulation results showing the phase of the third-order intermodulation products for the three approaches of FIG. 8A/8B, in accordance with one embodiment. Phase is plotted in a polar format, with each "x" corresponding to a different channel in the phased array. When the intermodulation distortions for all channels are clustered together in phase, one skilled in the art will see that when these distortions are added together, they will add coherently, resulting in the Correlated Spurs case from FIG. 1. When the intermodulation distortions for all channels are spread around in phase, one skilled in the art will see that when these distortions are added together, they will add noncoherently, resulting in the Uncorrelated Spurs case from FIG. 1. The top row of the chart of FIG. 10 has the intermod magnitudes of each channel normalized to unity, for the cases of no NLEQ applied (chart 1002), Case A NLEQ individually generated and individually applied (chart 1004), Case B beamspace generated and individually applied (chart 1006), and Case C beamspace generated and beamspace applied). Similarly, the lower row in FIG. 10 shows the phase of one of the third-order intermodulation products when the magnitude is not normalized, for when no NLEQ is applied (chart 1010), for Case A (chart 1012), for Case B (chart 1014), and for Case C (chart 1016). In these charts, those of skill in the art will see that Case B achieves phase decorrelation of the intermod among the various channels that is not seen in Cases A and C, as shown by the spreading of phase throughout the unit circle.

Figure 11:
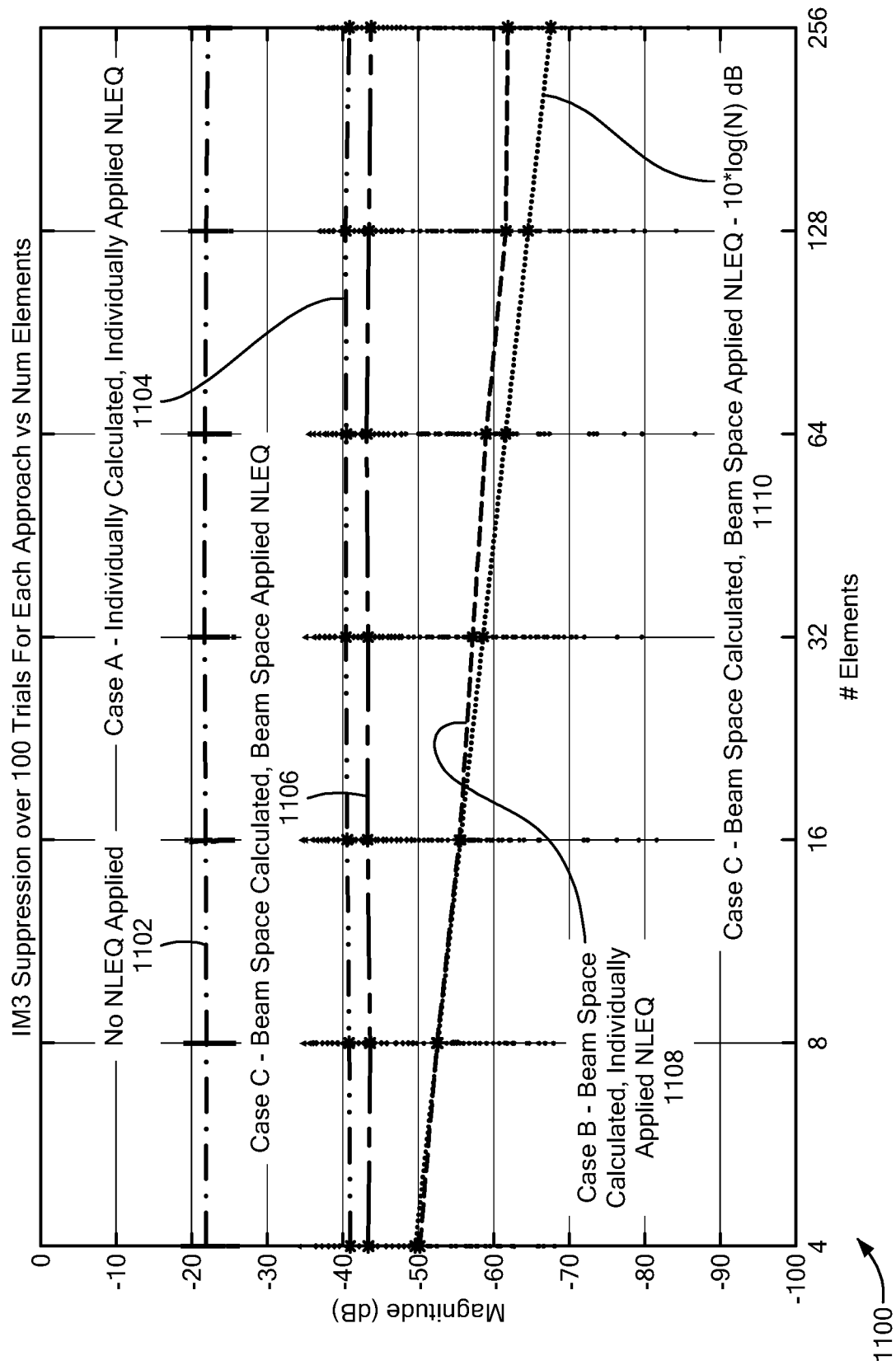
FIG. 11 is an exemplary third set of simulation results providing a parametric study over array size, for the three approaches of FIGS. 8A and 8B, in accordance with one embodiment.

FIG. 11 is an exemplary third set 1100 of simulation results providing a parametric study over array size, for the three approaches of FIG. 8, in accordance with one embodiment. The parametric study of FIG. 11 analyzed each array-level NLEQ technique over array sizes from 4 to 256 elements. Each element size was analyzed over 100 random trials. The nonlinear characteristics were randomly varied across each channel and across each trial, and the two-tone frequencies were varied over each trial as well. The two-tone frequency separates were kept small, corresponding to a narrowband case. As the data in FIG. 11 shows, the line 1102 for no NLEQ applied, demonstrated an IM3 that remained constant, independent of array size, at roughly 20 dB down from the fundamental. Case A 1104 showed IM3 suppression of about 40 dB which was constant with array size. Case C 1106 showed approximate IM3 suppression of approximately 42 dB which was constant with array size. However, Case B 1108 showed strong partial decorrelation and improvement with array size—note how the IM3 suppression for Case B was approximately 50 dB at 4 elements and reached 60 dB at 128 elements. It will be appreciated that this improvement can be even more significant in really large arrays. In the graph of FIG. 11, Case C is considered to be a "baseline", and then the ideal decorrelation 10*log 10(N) dB scaling is provided (1110) to compare the performance of Case C performance to Case B, which shows a decorrelation effect. As will be appreciated, the graph of FIG. 11 shows that, in certain embodiments, part of the improvement in $3^{rd}$ order intermodulation distortion suppression is due to cancellation, which all three cases do, and part of the improvement is due to decorrelation, which only Case B provides.

FIG. 12 is an exemplary table 1200 summarizing simulation results and other performance information for the three approaches of FIGS. 8A/8B, as compared to an approach with no NLEQ, in accordance with one embodiment. This table 1200 also shows different tradeoffs that are made for each approach. Note that for the topic of IM3 suppression in Case B, based on the curve fit of Case B in the parametric data of FIG. 11, it is possible based on the simulation that the decorrelation effect that the improvement could reach a saturation point at large numbers of antenna elements. However, the IM3 suppression for Case B, as compared to no NLEQ and Cases A and C, is still significant. Additional advantages include that, because the approach at Case B applies the same coefficient in every channel, there is not extra coefficient storage space required at element level, as would be required in Case A (which requires storage of a coefficient at each channel). Instead, there is only a need to store the single coefficient at beamspace (similar to Case C). This reduces overall circuit complexity and cost, as will be appreciated.

It is envisioned that any or all of the embodiments described herein and/or illustrated in FIGS. 1-12 herein could be combined with and/or adapted to work with the technologies described in one or more of the commonly assigned U.S. patent applications and patents, including but not limited to the aforementioned incorporated by reference patents and publication. It should be understood, however, that the disclosed embodiments are not limited to use with the above-listed exemplary systems. The embodiments described herein have numerous applications and are not limited to the exemplary applications described herein. It should be appreciated that such references and examples are made in an effort to promote clarity in the description of the concepts disclosed herein. Such references are not intended as, and should not be construed as, limiting the use or application of the concepts, systems, arrangements, and techniques described herein to use solely with these or any other systems.

Figure 13:
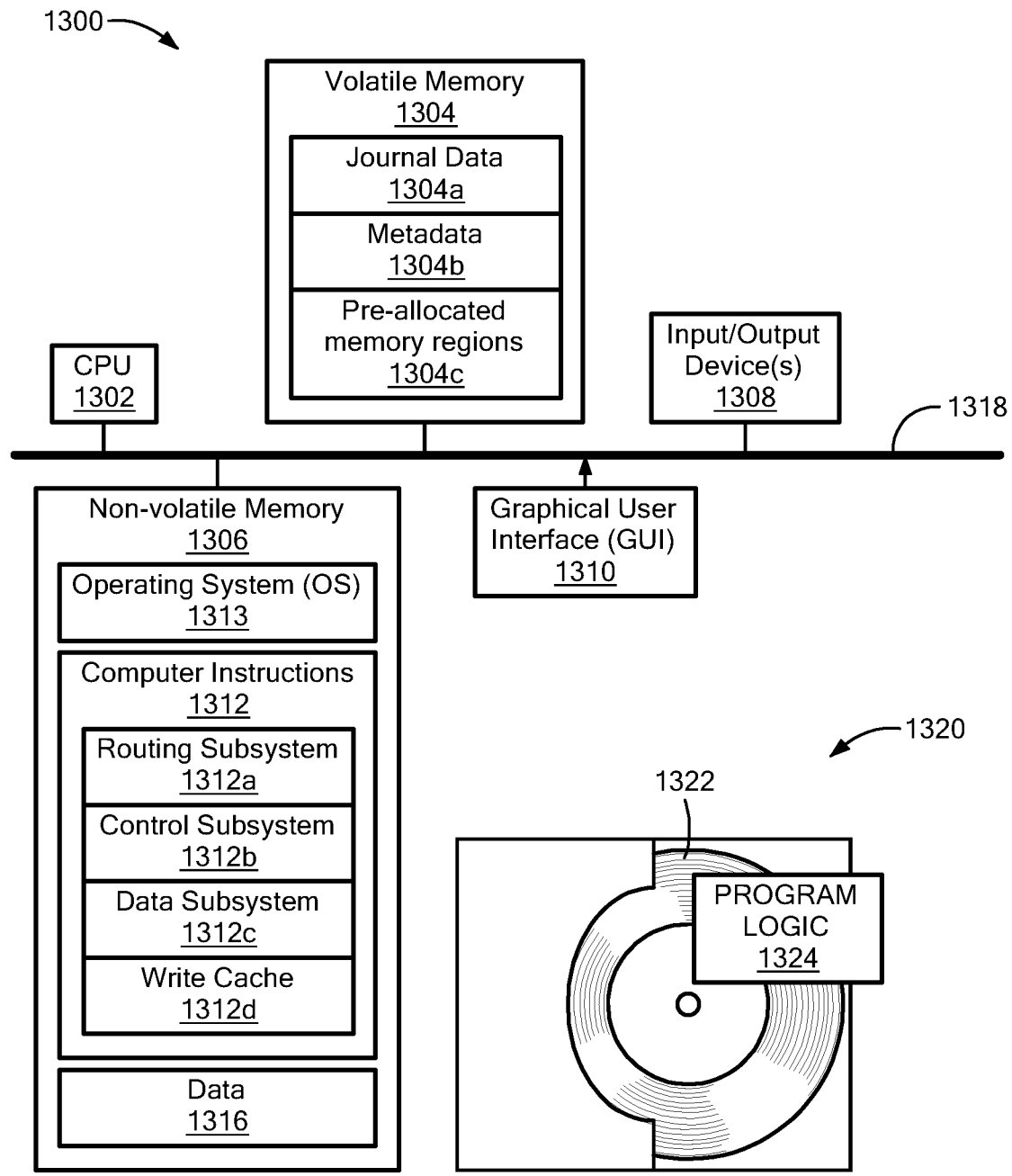
FIG. 13 is a block diagram of an exemplary computer system usable with at least some of the systems and apparatuses of FIGS. 1-12, in accordance with one embodiment.

FIG. 13 is a block diagram of an exemplary computer system usable with at least some of the systems and apparatuses of FIGS. 1-12, in accordance with one embodiment. In some embodiments, the computer system 1300 of FIG. 13 can be usable as the computer(s) used in the system and signal processing block 516 of FIGS. 5A, 5B and 5C, for example. Reference is made briefly to FIG. 13, which shows a block diagram of a general purpose computer system 1300 usable with at least some embodiments. The computer system 1300 also can be used to implement all or part of any of the methods, equations, and/or calculations described herein.

As shown in FIG. 13, computer 1300 may include processor/CPU 1302, volatile memory 1304 (e.g., RAM), non-volatile memory 1306 (e.g., one or more hard disk drives (HDDs), one or more solid state drives (SSDs) such as a flash drive, one or more hybrid magnetic and solid state drives, and/or one or more virtual storage volumes, such as a cloud storage, or a combination of physical storage volumes and virtual storage volumes), graphical user interface (GUI) 1310 (e.g., a touchscreen, a display, and so forth) and input and/or output (I/O) device 1308 (e.g., a mouse, a keyboard, etc.). Non-volatile memory 1304 stores, e.g., journal data 1304a, metadata 1304b, and pre-allocated memory regions 1304c. The non-volatile memory, 1306 can include, in some embodiments, an operating system 1314, and computer instructions 1312, and data 1316. In certain embodiments, the computer instructions 1312 are configured to provide several subsystems, including a routing subsystem 1312A, a control subsystem 1312b, a data subsystem 1312c, and a write cache 1312d. In certain embodiments, the computer instructions 1312 are executed by the processor/CPU 1302 out of volatile memory 1304 to implement and/or perform at least a portion of the systems and processes shown in FIGS. 1-15. Program code also may be applied to data entered using an input device or GUI 1310 or received from I/O device 1308.

The systems, architectures, and processes of FIGS. 1-13 are not limited to use with the hardware and software described and illustrated herein and may find applicability in any computing or processing environment and with any type of machine or set of machines that may be capable of running a computer program and/or of implementing a radar system (including, in some embodiments, software defined radar). The processes described herein may be implemented in hardware, software, or a combination of the two. The logic for carrying out the methods discussed herein may be embodied as part of the system described in FIG. 13. The processes and systems described herein are not limited to the specific embodiments described, nor are they specifically limited to the specific processing order shown. Rather, any of the blocks of the processes may be re-ordered, combined, or removed, performed in parallel or in serial, as necessary, to achieve the results set forth herein.

Processor 1302, or any processor used to implement the embodiments included herein, may be implemented by one or more programmable processors executing one or more computer programs to perform the functions of the system. As used herein, the term "processor" describes an electronic circuit that performs a function, an operation, or a sequence of operations. The function, operation, or sequence of operations may be hard coded into the electronic circuit or soft coded by way of instructions held in a memory device. A "processor" may perform the function, operation, or sequence of operations using digital values or using analog signals. In some embodiments, the "processor" can be embodied in one or more application specific integrated circuits (ASICs). In some embodiments, the "processor" may be embodied in one or more microprocessors with associated program memory. In some embodiments, the "processor" may be embodied in one or more discrete electronic circuits. The "processor" may be analog, digital, or mixed-signal. In some embodiments, the "processor" may be one or more physical processors or one or more "virtual" (e.g., remotely located or "cloud") processors.

Various functions of circuit or system elements may also be implemented as processing blocks in a software program. Such software may be employed in, for example, one or more digital signal processors, microcontrollers, or general-purpose computers. Described embodiments may be implemented in hardware, a combination of hardware and software, software, or software in execution by one or more physical or virtual processors.

Some embodiments may be implemented in the form of methods and apparatuses for practicing those methods. Described embodiments may also be implemented in the form of program code, for example, stored in a storage medium, loaded into and/or executed by a machine, or transmitted over some transmission medium or carrier, such as over electrical wiring or cabling, through fiber optics, or via electromagnetic radiation. A non-transitory machine-readable medium may include but is not limited to tangible media, such as magnetic recording media including hard drives, floppy diskettes, and magnetic tape media, optical recording media including compact discs (CDs) and digital versatile discs (DVDs), solid state memory such as flash memory, hybrid magnetic and solid-state memory, non-volatile memory, volatile memory, and so forth, but does not include a transitory signal per se. When embodied in a non-transitory machine-readable medium and the program code is loaded into and executed by a machine, such as a computer, the machine becomes an apparatus for practicing the method.

When implemented on one or more processing devices, the program code segments combine with the processor to provide a unique device that operates analogously to specific logic circuits. Such processing devices may include, for example, a general-purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, a multi-core processor, and/or others, including combinations of one or more of the above. Described embodiments may also be implemented in the form of a bitstream or other sequence of signal values electrically or optically transmitted through a medium, stored magnetic-field variations in a magnetic recording medium, etc., generated using a method and/or an apparatus as recited in the claims.

For example, when the program code is loaded into and executed by a machine, such as the computer of FIG. 13, the machine becomes an apparatus for practicing one or more of the described embodiments. When implemented on one or more general-purpose processors, the program code combines with such a processor to provide a unique apparatus that operates analogously to specific logic circuits. As such a general-purpose digital machine can be transformed into a special purpose digital machine. FIG. 13 shows Program Logic 1324 embodied on a computer-readable medium 1320 as shown, and wherein the Logic is encoded in computer-executable code configured for carrying out the reservation service process of this invention and thereby forming a Computer Program Product 1322. The logic may be the same logic on memory loaded on processor. The program logic may also be embodied in software modules, as modules, or as hardware modules. A processor may be a virtual processor or a physical processor. Logic may be distributed across several processors or virtual processors to execute the logic.

In some embodiments, a storage medium may be a physical or logical device. In some embodiments, a storage medium may consist of physical or logical devices. In some embodiments, a storage medium may be mapped across multiple physical and/or logical devices. In some embodiments, storage medium may exist in a virtualized environment. In some embodiments, a processor may be a virtual or physical embodiment. In some embodiments, a logic may be executed across one or more physical or virtual processors.

For purposes of illustrating the present embodiments, the disclosed embodiments are described as embodied in a specific configuration and using special logical arrangements, but one skilled in the art will appreciate that the device is not limited to the specific configuration but rather only by the claims included with this specification. In addition, it is expected that during the life of a patent maturing from this application, many relevant technologies will be developed, and the scopes of the corresponding terms are intended to include all such new technologies a priori.

The terms "comprises," "comprising", "includes", "including", "having" and their conjugates at least mean "including but not limited to". As used herein, the singular form "a," "an" and "the" includes plural references unless the context clearly dictates otherwise. Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

Throughout the present disclosure, absent a clear indication to the contrary from the context, it should be understood individual elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, and/or a data signal. Within the drawings, like or related elements have like or related alpha, numeric or alphanumeric designators (e.g., a component labeled as "204" in FIG. 2 may be similar to a component labeled "404" in FIG. 4, etc.). Further, while the disclosed embodiments have been discussed in the context of implementations using discrete components, including some components that include one or more integrated circuit chips), the functions of any component or circuit may alternatively be implemented using one or more appropriately programmed processors, depending upon the signal frequencies or data rates to be processed and/or the functions being accomplished.

Similarly, in addition, in the Figures of this application, in some instances, a plurality of system elements may be shown as illustrative of a particular system element, and a single system element or may be shown as illustrative of a plurality of particular system elements. It should be understood that showing a plurality of a particular element is not intended to imply that a system or method implemented in accordance with the invention must comprise more than one of that element, nor is it intended by illustrating a single element that the invention is limited to embodiments having only a single one of that respective elements. In addition, the total number of elements shown for a particular system element is not intended to be limiting; those skilled in the art can recognize that the number of a particular system element can, in some instances, be selected to accommodate the particular user needs.

In describing and illustrating the embodiments herein, in the text and in the figures, specific terminology (e.g., language, phrases, product brands names, etc.) may be used for the sake of clarity. These names are provided by way of example only and are not limiting. The embodiments described herein are not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, elements, circuits, modules, tables, software modules, systems, etc. Such terminology used herein, however, is for the purpose of description and not limitation.

Although the embodiments included herein have been described and pictured in an advantageous form with a certain degree of particularity, it is understood that the present disclosure has been made only by way of example, and that numerous changes in the details of construction and combination and arrangement of parts may be made without departing from the spirit and scope of the described embodiments. Having described and illustrated at least some the principles of the technology with reference to specific implementations, it will be recognized that the technology and embodiments described herein can be implemented in many other, different, forms, and in many different environments. The technology and embodiments disclosed herein can be used in combination with other technologies. In addition, all publications and references cited herein are expressly incorporated herein by reference in their entirety.

What is claimed is:

1. A method of beamforming, the method comprising:
generating a single non-linear equalization (NLEQ) coefficient set in beamspace, the single NLEQ coefficient set configured to characterize non-linear behavior of a system having an array of N elements;
receiving M parallel digital signals for transmission by N channels, respectively, the N channels corresponding to the N elements;
equalizing each of the M respective parallel digital signals, using an NLEQ filter based on the single NLEQ coefficient set, wherein the single NLEQ coefficient set is used for each of the N elements and wherein the equalizing is configured to generate a set of M linearized parallel digital signals; and
summing, using a digital summer, the M linearized parallel digital signals, to produce one or more beamspace output signals.

2. The method of claim 1, wherein the equalization is configured to provide at least partial decorrelation between the N channels.

3. The method of claim 1, wherein the NLEQ filter is configured to provide non-uniform correction of $3^{rd}$ order intermodulation products in the M parallel digital signals.

4. The method of claim 3, wherein the non-uniform correction comprises under-correlation of a first portion of the $3^{rd}$ order intermodulation products and over-correlation of a second portion of the $3^{rd}$ order intermodulation products.

5. The method of claim 4 wherein a complex summation of the first portion of the elements roughly equals a negative complex summation of the second portion of the elements, wherein a limit of the complex summation of all intermodulation products for individual frequency bins of the system approaches zero as the number of elements N increases.

6. The method of claim 4, wherein the M linearized parallel digital signals that are provided to the summer, includes the first portion of under-correlated $3^{rd}$ order intermodulation products and second portion of over-correlated $3^{rd}$ order intermodulation products, wherein, when the summer adds the first and second portions of $3^{rd}$ order intermodulation products together, the first and second portions cancel each other out to produce at least a partial decorrelation of the M channelized output signals.

7. The method of claim 1, wherein the M parallel digital signals include $3^{rd}$ order intermodulation products, and wherein the NLEQ filter is configured so that at least a first portion of the $3^{rd}$ order intermodulation products is approximately 180 degrees out of phase from a second portion of the $3^{rd}$ order intermodulation products.

8. The method of claim 1 further comprising performing a linear transfer function on each of the M parallel digital signals after the equalizing and before the summing.

9. The method of claim 1, further comprising performing a linear transfer function on each of the M parallel digital signals, before the equalizing.

10. The method of claim 1, wherein the NLEQ filter comprises at least one of a Volterra filter and a derivative of a Volterra filter.

11. The method of claim 1, wherein M is a nonzero positive number corresponding to a number of outputs of the system, wherein generating the NLEQ coefficient set further comprises applying a measured calibration test signal to the system, and wherein, prior to generating the NLEQ coefficient set, the measured calibration test signal is scaled by M prior to generating the NLEQ coefficient set.

12. The method of claim 1, further comprising serializing the M channelized output signals to produce a linearized signal in beamspace.

13. A beamforming system, comprising:
a processor configured to generate a single non-linear equalization (NLEQ) coefficient set in beamspace, the single NLEQ coefficient set configured to characterize non-linear behavior of a system having an array of N elements;
a receiver configured to receive M parallel digital signals for transmission by N channels, respectively, the N channels corresponding to the N elements;
an equalizer configured for equalizing each of the M respective parallel digital signals, using an NLEQ filter based on the single NLEQ coefficient set, wherein the single NLEQ coefficient set is used for each of the N elements and wherein the equalizing is configured to generate a set of M linearized parallel digital signals; and
a summer configured to add together the M linearized parallel digital signals, to produce one or more beamspace channelized output signals.

14. The system of claim 13, wherein the M parallel digital signals provided to the equalizer includes $3^{rd}$ order intermodulation products and wherein the NLEQ filter is configured to provide under-correlation of a first portion of the $3^{rd}$ order intermodulation products and over-correlation of a second portion of the $3^{rd}$ order intermodulation products.

15. The system of claim 14, wherein the M linearized parallel digital signals that are provided to the summer, includes the first portion of under-correlated $3^{rd}$ order intermodulation products and the second portion of over-correlated $3^{rd}$ order intermodulation products, wherein, when the summer adds the first and second portions of $3^{rd}$ order intermodulation products together, the first and second portions cancel each other out to produce at least a partial decorrelation of the M channelized output signals.

16. The system of claim 13, wherein the NLEQ filter comprises at least one of a Volterra filter and a derivative of a Volterra filter.

17. A non-linear equalization system, comprising:
a processor configured to generate a single non-linear equalization (NLEQ) coefficient set configured to characterize non-linear behavior of a system having N channels;
an equalizer configured for equalizing each of the N respective parallel digital signals that are received at the N channels, using an NLEQ filter based on the single NLEQ coefficient set, wherein the single NLEQ coefficient set is used for each of the N channels, and wherein the equalizing is configured to generate a set of N linearized parallel digital signals; and
a summer configured to add together the set of N linearized parallel digital signals.

18. The non-linear equalization system of claim 17, wherein the M parallel digital signals provided to the equalizer includes $3^{rd}$ order intermodulation products and wherein the NLEQ filter is configured to provide under-correlation of a first portion of the $3^{rd}$ order intermodulation products and over-correlation of a second portion of the $3^{rd}$ order intermodulation products.

19. The non-linear equalization system of claim 18, wherein the M linearized parallel digital signals that are provided to the summer, includes the first portion of under-correlated $3^{rd}$ order intermodulation products and the second portion of over-correlated $3^{rd}$ order intermodulation products, wherein, when the summer adds the first and second portions of $3^{rd}$ order intermodulation products together, the first and second portions cancel each other out to produce at least a partial decorrelation of the M channelized output signals.

20. The non-linear equalization system of claim 17, wherein the NLEQ filter comprises at least one of a Volterra filter and a derivative of a Volterra filter.

* * * * *